US010754251B2

(12) United States Patent
Tanaka et al.

(10) Patent No.: US 10,754,251 B2
(45) Date of Patent: Aug. 25, 2020

(54) DEVELOPMENT UNIT, SUBSTRATE PROCESSING APPARATUS, DEVELOPMENT METHOD AND SUBSTRATE PROCESSING METHOD

(71) Applicant: SCREEN HOLDINGS CO., LTD., Kyoto (JP)

(72) Inventors: Yuji Tanaka, Kyoto (JP); Masaya Asai, Kyoto (JP); Masahiko Harumoto, Kyoto (JP); Koji Kaneyama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/073,861

(22) PCT Filed: Feb. 3, 2017

(86) PCT No.: PCT/JP2017/004035
§ 371 (c)(1),
(2) Date: Jul. 30, 2018

(87) PCT Pub. No.: WO2017/141737
PCT Pub. Date: Aug. 24, 2017

(65) Prior Publication Data
US 2019/0041755 A1    Feb. 7, 2019

(30) Foreign Application Priority Data
Feb. 17, 2016    (JP) .................................. 2016-028011

(51) Int. Cl.
*G03D 5/00*    (2006.01)
*G03F 7/32*    (2006.01)
(Continued)

(52) U.S. Cl.
CPC ............ *G03F 7/322* (2013.01); *G03F 7/0044* (2013.01); *G03F 7/091* (2013.01); *G03F 7/16* (2013.01);
(Continued)

(58) Field of Classification Search
USPC ....................................................... 396/611
See application file for complete search history.

(56) References Cited

U.S. PATENT DOCUMENTS

| | | |
|---|---|---|
| 5,279,771 A | 1/1994 | Lee |
| 5,334,332 A | 8/1994 | Lee |

(Continued)

FOREIGN PATENT DOCUMENTS

| | | |
|---|---|---|
| EP | 0 042 894 A1 | 1/1982 |
| JP | S61-278506 A | 12/1986 |

(Continued)

OTHER PUBLICATIONS

Decision to Grant a Patent dated Dec. 27, 2018 for corresponding Taiwan Patent Application No. 106104239.

(Continued)

*Primary Examiner* — Rodney E Fuller
(74) *Attorney, Agent, or Firm* — Ostrolenk Faber LLP

(57) ABSTRACT

A substrate having a film of a coating liquid containing metal is held by a spin chuck, the film having been exposed in a predetermined pattern. A slit nozzle supplies a development liquid to a surface to be processed of the substrate supported by the spin chuck. A cleaning liquid for removing or dissolving metal is supplied by a cleaning nozzle to the surface to be processed of the substrate to which the development liquid has been supplied.

18 Claims, 14 Drawing Sheets

(51) Int. Cl.

| | | |
|---|---|---|
| *G03F 7/30* | (2006.01) | |
| *H01L 21/67* | (2006.01) | |
| *H01L 21/027* | (2006.01) | |
| *G03F 7/16* | (2006.01) | |
| *H01L 21/677* | (2006.01) | |
| *G03F 7/004* | (2006.01) | |
| *G03F 7/40* | (2006.01) | |
| *H01L 21/02* | (2006.01) | |
| *G03F 7/09* | (2006.01) | |
| *G03F 7/20* | (2006.01) | |

(52) U.S. Cl.
CPC ............ *G03F 7/168* (2013.01); *G03F 7/2004* (2013.01); *G03F 7/3057* (2013.01); *G03F 7/325* (2013.01); *G03F 7/40* (2013.01); *G03F 7/70925* (2013.01); *H01L 21/02057* (2013.01); *H01L 21/0274* (2013.01); *H01L 21/6715* (2013.01); *H01L 21/67028* (2013.01); *H01L 21/67051* (2013.01); *H01L 21/67173* (2013.01); *H01L 21/67178* (2013.01); *H01L 21/67742* (2013.01)

(56) References Cited

U.S. PATENT DOCUMENTS

| | | | |
|---|---|---|---|
| 5,911,835 A | 6/1999 | Lee et al. ..................... 134/1.3 | |
| 5,981,454 A | 11/1999 | Small ........................... 510/175 | |
| 2001/0037858 A1* | 11/2001 | Taniyama ......... H01L 21/67051 | |
| | | | 156/345.21 |
| 2002/0036183 A1* | 3/2002 | Shibata ..................... G03F 7/40 | |
| | | | 216/44 |
| 2007/0183775 A1* | 8/2007 | Mitsuhashi ........... G03F 7/3021 | |
| | | | 396/611 |
| 2008/0015278 A1 | 1/2008 | Malik et al. .................. 522/150 | |
| 2008/0045682 A1 | 2/2008 | Schwab ........................ 526/241 | |
| 2011/0092653 A1 | 4/2011 | Schwab ........................ 525/370 | |
| 2011/0170855 A1 | 7/2011 | Mitsuhashi et al. .......... 396/611 | |
| 2011/0184139 A1 | 7/2011 | Malik et al. .................. 526/240 | |
| 2011/0207031 A1 | 8/2011 | Sakurai et al. ................... 430/5 | |
| 2011/0293888 A1 | 12/2011 | Stowers et al. | |
| 2012/0070613 A1 | 3/2012 | Stowers et al. | |
| 2012/0125216 A1 | 5/2012 | Levanon et al. .............. 101/453 | |
| 2012/0315451 A1* | 12/2012 | Malik ....................... C08F 4/06 | |
| | | | 428/209 |
| 2013/0141708 A1 | 6/2013 | Sakurai et al. .................. 355/67 | |
| 2014/0071411 A1 | 3/2014 | Takiguchi et al. | |
| 2014/0170332 A1* | 6/2014 | Iwao ....................... G03F 7/168 | |
| | | | 427/553 |
| 2015/0044617 A1 | 2/2015 | Sugawara et al. | |
| 2015/0056542 A1 | 2/2015 | Meyers et al. | |
| 2015/0099228 A1 | 4/2015 | Hatakeyama et al. | |
| 2015/0194942 A1 | 7/2015 | Anderson et al. | |
| 2016/0011505 A1 | 1/2016 | Stowers et al. | |
| 2016/0202609 A1 | 7/2016 | Takiguchi et al. | |
| 2016/0216606 A1 | 7/2016 | Meyers et al. | |
| 2016/0342090 A1* | 11/2016 | Tsuchimura .......... G03F 7/0397 | |
| 2017/0070199 A1 | 3/2017 | Anderson et al. | |
| 2017/0077877 A1 | 3/2017 | Anderson | |
| 2018/0039172 A1 | 2/2018 | Stowers et al. | |
| 2018/0088466 A1* | 3/2018 | Kawakami ................ G03F 7/11 | |

FOREIGN PATENT DOCUMENTS

| | | |
|---|---|---|
| JP | H06-124887 A | 5/1994 |
| JP | 06-266119 A | 9/1994 |
| JP | 2001-110714 A | 4/2001 |
| JP | 2007-214200 A | 4/2001 |
| JP | 2001-319849 A | 11/2001 |
| JP | 2003-103228 A | 4/2003 |
| JP | 2009-094406 A | 4/2009 |
| JP | 2009-302277 A | 12/2009 |
| JP | 2011-176218 A | 9/2011 |
| JP | 2011-253185 A | 12/2011 |
| JP | 2011-530652 A | 12/2011 |
| JP | 2013-045864 A | 3/2013 |
| JP | 2014-075575 A | 4/2014 |
| JP | 2014-120620 A | 6/2014 |
| JP | 2015-031923 A | 2/2015 |
| JP | 2015-075500 A | 4/2015 |
| TW | 396202 B | 7/2000 |
| TW | 201222144 A1 | 6/2012 |
| TW | 201229174 A1 | 7/2012 |
| TW | 201510678 A | 3/2015 |

OTHER PUBLICATIONS

International Search Report dated May 9, 2017 in corresponding PCT International Application No. PCT/JP2017/004035.

Written Opinion dated May 9, 2017 in corresponding PCT International Application No. PCT/JP2017/004035.

Office Action dated Nov. 12, 2019 in corresponding Japanese Patent Application No. 2016-028011.

Office Action dated Apr. 14, 2020 in corresponding Japanese Patent Application No. 2016-028011.

Minoru Araiviaki, "Trifluoromethanesulfonic acid", Organic Synthetic Chemistry, Japan, Organic Synthetic Chemistry Association, Aug. 1, 1988, vol. 46, No. 8, pp. 821-823 (with English Machine Translation).

Peter Hronsky "Corrosion Behavior of Metallic in Organic Media Containing Hydrogen Chloride", Corrosion, [online], Mar. 1981, National Association of Corrosion Engineers.

Ewald Heitz, "Corrosion of Metals in Organic Solvents", Advances in Corrosion Science and Technology, vol. 4, pp. 149-150 [online], 1974, Plenum Press.

* cited by examiner

DEVELOPMENT UNIT, SUBSTRATE PROCESSING APPARATUS, DEVELOPMENT METHOD AND SUBSTRATE PROCESSING METHOD

CROSS-REFERENCE TO RELATED APPLICATIONS

The present application is a 35 U.S.C. §§ 371 national phase conversion of PCT/JP2017/004035, filed Feb. 3, 2017, which claims priority to Japanese Patent Application No. 2016-028011, filed Feb. 17, 2016, the contents of both of which are incorporated herein by reference. The PCT International Application was published in the Japanese language.

TECHNICAL FIELD

The present invention relates to a development unit, a substrate processing apparatus, a development method and a substrate processing method for performing development processing on a substrate.

BACKGROUND ART

In a lithography process in the manufacture of a semiconductor device or the like, a coating liquid such as a resist liquid is supplied onto an underlayer of a surface of a substrate, so that a coating film is formed. The coating film is exposed, and then a development liquid is supplied onto the coating film. Thus, a predetermined pattern is formed on the coating film (see Patent Document 1, for example).

[Patent Document 1] JP 2014-75575 A

SUMMARY OF INVENTION

Technical Problem

In recent years, application of a coating film containing a metallic component (hereinafter referred to as a metal-containing coating film) has been studied for the formation of finer patterns. However, according to an experiment conducted by the inventors, it is found that, even when the developed substrate is cleaned with use of a rinse liquid, a metallic component may not be completely removed and may remain.

When a metallic component remains in the underlayer of the surface of the substrate, a defect may occur in a pattern formed by etching in the underlayer. Therefore, accuracy of substrate processing is degraded. Further, when a metallic component adheres to an end portion or a back surface of the substrate, a substrate processing apparatus including a transport mechanism and the adjacent exposure device may be contaminated.

An object of the present invention is to provide a development unit and a substrate processing apparatus capable of improving accuracy of substrate processing while preventing metallic contamination, and a development method and a substrate processing method with which accuracy of the substrate processing can be improved while the metallic contamination is prevented.

Solution to Problem (1) A development unit according to one aspect of the present invention that performs development processing on a substrate having a film of a coating liquid containing metal formed on a surface to be processed as a metal-containing coating film includes a substrate holder that holds the substrate having the metal-containing coating film exposed in a predetermined pattern, a development liquid supplier that supplies a development liquid to the surface to be processed of the substrate supported by the substrate holder, and a cleaning liquid supplier that supplies a cleaning liquid for removing or dissolving metal to the surface to be processed of the substrate to which the development liquid has been supplied by the development liquid supplier.

In this development unit, the substrate having the metal-containing coating film that has been exposed in the predetermined pattern is held by the substrate holder. The development liquid is supplied to the surface to be processed of the substrate supported by the substrate holder. The cleaning liquid for removing or dissolving metal is supplied to the surface to be processed of the substrate to which the development liquid has been supplied.

In this configuration, even when the metal in the metal-containing coating film that is dissolved in the development liquid adheres to the surface to be processed of the substrate to which the development liquid has been supplied, the metal is removed by the cleaning liquid or dissolved in the cleaning liquid. Thus, the metal does not remain in the underlayer of the surface of the substrate to which the cleaning liquid has been supplied, so that a defect caused by the metal does not occur in the pattern formed by etching in the underlayer. As a result, accuracy of the substrate processing can be improved while the metallic contamination is prevented.

(2) The substrate holder may hold the substrate on which positive tone development processing is to be performed, the development liquid may include an alkaline aqueous solution, and the cleaning liquid may include an aqueous solution to which a chelating agent is added, an alkaline aqueous solution or an acid aqueous solution.

In this case, the metal adhering to the substrate can be easily removed or easily dissolved. Further, it is not necessary to collect the development liquid and the cleaning liquid separately. Thus, the cost for discarding the development liquid and the cleaning liquid can be lowered.

(3) The development unit may further include a rinse liquid supplier that supplies a rinse liquid to the surface to be processed of the substrate to which the cleaning liquid has been supplied by the cleaning liquid supplier, wherein the rinse liquid may include an aqueous solution.

In this case, because the cleaning liquid adhering to the substrate is removed by the rinse liquid, the substrate can be maintained cleaner. Further, it is not necessary to collect the development liquid, the cleaning liquid and the rinse liquid separately. Thus, the cost for discarding the development liquid, the cleaning liquid and the rinse liquid can be lowered.

(4) The chelating agent may include one type or a plurality of types selected from a group including an organic acid, an organic acid salt, an amino acid, an amino acid derivative, inorganic alkali, an inorganic alkali salt, an alkylamine, an alkylamine derivative, an alkanolamine and an alkanolamine derivative.

In this case, it is possible to sufficiently remove or sufficiently dissolve the metal adhering to the substrate without damaging the pattern of the metal-containing coating film. Thus, the accuracy of the substrate processing can be more sufficiently improved.

(5) The substrate holder may hold the substrate on which negative tone development processing is to be performed, the development liquid may include an organic solvent, and the cleaning liquid may include an organic solvent to which a chelating agent is added.

In this case, the metal adhering to the substrate can be easily removed or easily dissolved. Further, it is not necessary to collect the development liquid and the cleaning liquid separately. Thus, the cost for discarding the development liquid and the cleaning liquid can be lowered.

(6) The development unit may further include a rinse liquid supplier that supplies a rinse liquid to the surface to be processed of the substrate to which the cleaning liquid has been supplied by the cleaning liquid supplier, wherein the rinse liquid may include an organic solvent.

In this case, the cleaning liquid adhering to the substrate is removed by the rinse liquid, so that the substrate can be maintained cleaner. Further, it is not necessary to collect the development liquid, the cleaning liquid and the rinse liquid separately. Thus, the cost for discarding the development liquid, the cleaning liquid and the rinse liquid can be lowered.

(7) The substrate holder may hold the substrate on which negative tone development processing is to be performed, the development liquid may include an organic solvent, and the cleaning liquid may include an aqueous solution to which a chelating agent is added. In this case, the metal adhering to the substrate can be easily removed or easily dissolved.

(8) The development unit may further include a rinse liquid supplier that supplies a rinse liquid to the surface to be processed of the substrate to which the cleaning liquid has been supplied by the cleaning liquid supplier, wherein the rinse liquid may have an aqueous solution.

In this case, the cleaning liquid adhering to the substrate is removed by the rinse liquid, so that the substrate can be maintained cleaner.

(9) The chelating agent may include an organic acid or an organic acid salt.

In this case, it is possible to sufficiently remove or sufficiently dissolve the metal adhering to the substrate without damaging the pattern of the metal-containing coating film. Thus, the accuracy of the substrate processing can be more sufficiently improved.

(10) A surfactant may further be added to the cleaning liquid. In this case, the pattern collapse of the metal-containing coating film can be prevented. Further, roughness of the pattern of the metal-containing coating film can be improved. As a result, the accuracy of the substrate processing can be more sufficiently improved.

(11) The development unit may further include a back surface cleaner that supplies a cleaning liquid for removing or dissolving metal to a back surface of the substrate to which the development liquid has been supplied by the development liquid supplier, the back surface being opposite to the surface to be processed.

In this configuration, even when the metal in the metal-containing coating film adheres to the back surface of the substrate to which the development liquid has been supplied, the metal is removed by the cleaning liquid or dissolved in the cleaning liquid. Thus, contamination of the development unit caused by the metal can be more sufficiently prevented.

(12) A substrate processing apparatus according to another aspect of the present invention that is arranged to be adjacent to an exposure device that exposes a surface to be processed of a substrate include a film formation unit that forms a metal-containing coating film on the surface to be processed by supplying a coating liquid containing metal to the surface to be processed of the substrate as a metal-containing coating liquid, a peripheral portion removal unit that supplies a removal liquid for dissolving metal to a peripheral portion of the substrate after the metal-containing coating film is formed by the film formation unit such that the metal-containing coating film remains in a region excluding the peripheral portion of the surface to be processed of the substrate, the development unit according to one aspect of the present invention that performs development processing on the substrate having the metal-containing coating film that is formed on the surface to be processed and has been exposed by the exposure device, and a transport mechanism that transports the substrate to which a removal liquid has been supplied by the peripheral portion removal unit to the exposure device, and transports the substrate that has been exposed by the exposure device to the development unit.

In this substrate processing apparatus, the coating liquid containing metal is supplied to the surface to be processed of the substrate as the metal-containing coating liquid, whereby the metal-containing coating film is formed on the surface to be processed. After the formation of the metal-containing coating film, the removal liquid for dissolving metal is supplied to the peripheral portion of the substrate such that the metal-containing coating film remains in a region excluding the peripheral portion of the surface to be processed of the substrate. The substrate to which the removal liquid has been supplied is carried into the exposure device by the transport mechanism, and the substrate that has been exposed by the exposure device is carried out from the exposure device by the transport mechanism. The development processing is performed by the above-mentioned development unit on the substrate having the metal-containing coating film that is formed on the surface to be processed and has been exposed by the exposure device.

In this configuration, the metal-containing coating film is formed on the surface to be processed of the substrate excluding the peripheral portion, and the metal is prevented from remaining on the peripheral portion of the substrate. Therefore, even when the peripheral portion of the substrate is held by the transport mechanism, the metal does not adhere to the transport mechanism. Thus, the metal-containing coating film can be formed on the substrate, and the metallic contamination can be prevented.

Further, even when the metal in the metal-containing coating film that is dissolved in the development liquid adheres to the surface to be processed of the substrate to which the development liquid has been supplied, the metal is removed by the cleaning liquid or dissolved in the cleaning liquid. Thus, the metal does not remain in the underlayer of the surface of the substrate to which the cleaning liquid has been supplied, so that a defect caused by the metal does not occur in the pattern formed by etching in the underlayer. As a result, accuracy of the substrate processing can be improved while the metallic contamination is prevented.

(13) A development method according to yet another aspect of the present invention of performing development processing on a substrate having a film of a coating liquid containing metal on a surface to be processed as a metal-containing coating film, including the steps of holding the substrate having the metal-containing coating film that is exposed in a predetermined pattern by a substrate holder, supplying a development liquid to the surface to be processed of the substrate supported by the substrate holder, and supplying a cleaning liquid for removing or dissolving metal to the surface to be processed of the substrate to which the development liquid has been supplied.

With this development method, the substrate having the metal-containing coating film that is exposed in the predetermined pattern is held by the substrate holder. The development liquid is supplied to the surface to be processed of the substrate supported by the substrate holder. The cleaning liquid for removing or dissolving metal is supplied to the surface to be processed of the substrate to which the development liquid has been supplied.

With this method, even when the metal in the metal-containing coating film that is dissolved in the development liquid adheres to the surface to be processed of the substrate to which the development liquid has been supplied, the metal is removed by the cleaning liquid or dissolved in the cleaning liquid. Thus, the metal does not remain in the underlayer of the surface of the substrate to which the cleaning liquid has been supplied, so that a defect caused by the metal does not occur in the pattern formed by etching in the underlayer. As a result, accuracy of the substrate processing can be improved while the metallic contamination is prevented.

(14) A substrate processing method according to yet another aspect of the present invention of exposing a surface to be processed of a substrate with use of an exposure device, including the steps of forming a metal-containing coating film on the surface to be processed by supplying a coating liquid containing metal to the surface to be processed of the substrate as a metal-containing coating liquid, supplying a removal liquid for dissolving metal to a peripheral portion of the substrate after the metal-containing coating film is formed such that the metal-containing coating film remains in a region excluding a peripheral portion of the surface to be processed of the substrate, carrying in the substrate to which the removal liquid has been supplied to the exposure device using a transport mechanism and carrying out the substrate that has been exposed by the exposure device from the exposure device using the transport mechanism, and performing development processing using the development method according to yet another aspect of the present invention on the substrate having the metal-containing coating film that is formed on the surface to be processed and has been exposed by the exposure device.

With this substrate processing method, the coating liquid containing metal is supplied to the surface to be processed of the substrate as the metal-containing coating liquid, whereby the metal-containing coating film is formed on the surface to be processed. After the metal-containing coating film is formed, the removal liquid for dissolving metal is supplied to the peripheral portion of the substrate such that the metal-containing coating film remains in the region excluding the peripheral portion of the surface to be processed of the substrate. The substrate to which the removal liquid has been supplied is carried in to the exposure device by the transport mechanism, and the substrate that has been exposed by the exposure device is carried out from the exposure device by the transport mechanism. The development processing is performed with use of the above-mentioned development method on the substrate having the metal-containing coating film that is formed on the surface to be processed and has been exposed by the exposure device.

With this method, the metal-containing coating film is formed on the surface to be processed of the substrate excluding the peripheral portion, and the metal is prevented from remaining on the peripheral portion of the substrate. Therefore, even when the peripheral portion of the substrate is held by the transport mechanism, the metal does not adhere to the transport mechanism. Thus, the metal-containing coating film can be formed on the substrate, and the metallic contamination of the transport mechanism or the exposure device can be prevented.

Further, even when the metal in the metal-containing coating film adheres to the substrate to which the development liquid has been supplied, the metal is removed by the cleaning liquid or dissolved in the cleaning liquid. Thus, the metal does not remain in the underlayer of the surface of the substrate to which the cleaning liquid has been supplied, so that a defect caused by the metal does not occur in the pattern formed by etching in the underlayer. As a result, it is possible to improve the accuracy of the substrate processing while preventing the metallic contamination.

Advantageous Effects of Invention

The present invention can improve accuracy of the substrate processing while preventing the metallic contamination.

DESCRIPTION OF EMBODIMENTS

A development unit, a substrate processing apparatus, a development method and a substrate processing method according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, as for the substrate used in the present embodiment, at least part of the substrate has a circular outer periphery. The outer periphery excluding a notch for positioning is circular, for example.

[1] First Embodiment (1) Substrate Processing Apparatus

Figure 1:
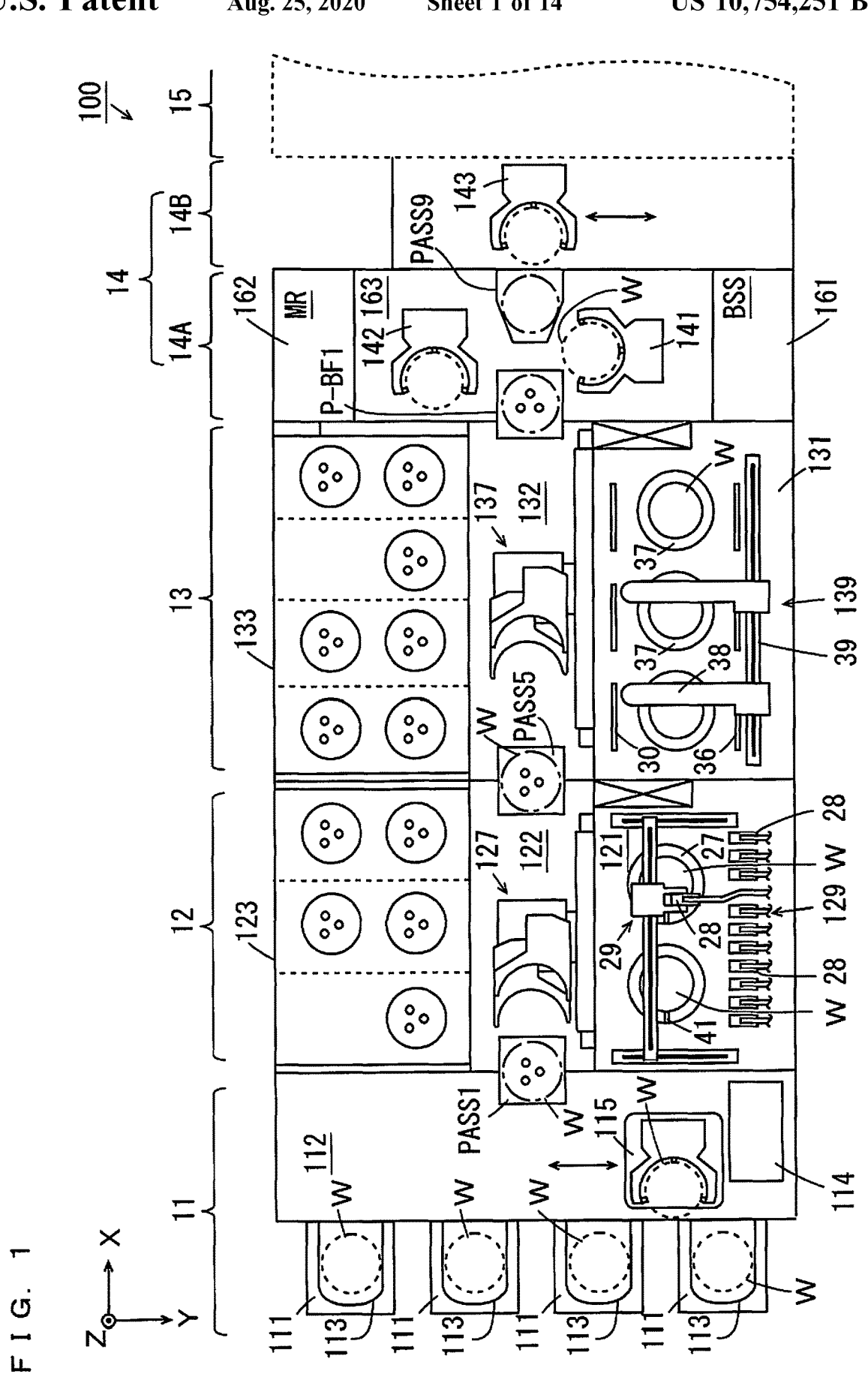
FIG. 1 is a schematic plan view of a substrate processing apparatus according to a first embodiment of the present invention.

FIG. 1 is a schematic plan view of the substrate processing apparatus according to the first embodiment of the present invention. FIG. 1 and the subsequent drawings are accompanied by arrows that indicate X, Y and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a coating block 12, a development block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the present example, the exposure device 15 performs exposure processing on the substrate W using EUV (Extreme Ultra Violet). A wavelength of the EUV is not less than 13 nm and not more than 14 nm.

As shown in FIG. 1, the indexer block 11 includes a plurality of carrier platforms 111 and a transport section 112. In each carrier platform 111, a carrier 113 for storing a plurality of substrates W in multiple stages is placed. In the transport section 112, a main controller 114 and a transport mechanism 115 are provided. The main controller 114 controls various constituent elements of the substrate processing apparatus 100. The transport mechanism 115 holds and transports the substrate W.

The coating block 12 includes a coating processing section 121, a transport section 122 and a thermal processing section 123. The coating processing section 121 and the thermal processing section 123 are provided to be opposite to each other with the transport section 122 interposed therebetween. Substrate platforms PASS1 to PASS4 (see FIG. 8) on which the substrates W are placed are provided between the transport section 122 and the indexer block 11. Transport mechanisms 127, 128 (see FIG. 8) for transporting the substrates W are provided in the transport section 122.

The development block 13 includes a development processing section 131, a transport section 132 and a thermal processing section 133. The development processing section 131 and the thermal processing section 133 are provided to be opposite to each other with the transport section 132 interposed therebetween. Substrate platforms PASS5 to PASS8 (see FIG. 8) on which the substrates W are placed are provided between the transport section 132 and the transport section 122. Transport mechanisms 137, 138 (see FIG. 8) for transporting the substrates W are provided in the transport section 132.

The cleaning drying processing block 14A includes cleaning drying processing sections 161, 162 and a transport section 163. The cleaning drying processing sections 161, 162 are provided to be opposite to each other with the transport section 163 interposed therebetween. Transport mechanisms 141, 142 are provided in the transport section 163. Placement buffer units P-BF1, P-BF2 (see FIG. 8) are provided between the transport section 163 and the transport section 132. The placement buffer units P-BF1, P-BF2 are configured to be able to store the plurality of substrates W.

Further, a substrate platform PASS9, below-mentioned edge exposure units EEW (see FIG. 8) and below-mentioned placement cooling units P-CP (see FIG. 8) are provided to be adjacent to the carry-in carry-out block 14B between the transport mechanisms 141, 142. The placement cooling units P-CP include a function of cooling the substrates W (cooling plates, for example). In the placement cooling units P-CP, the substrates W are cooled to a temperature suitable for the exposure processing. A transport mechanism 143 is provided in the carry-in carry-out block 14B. The transport mechanism 143 carries in the substrate W to and carries out the substrate W from the exposure device 15.

Figure 2:
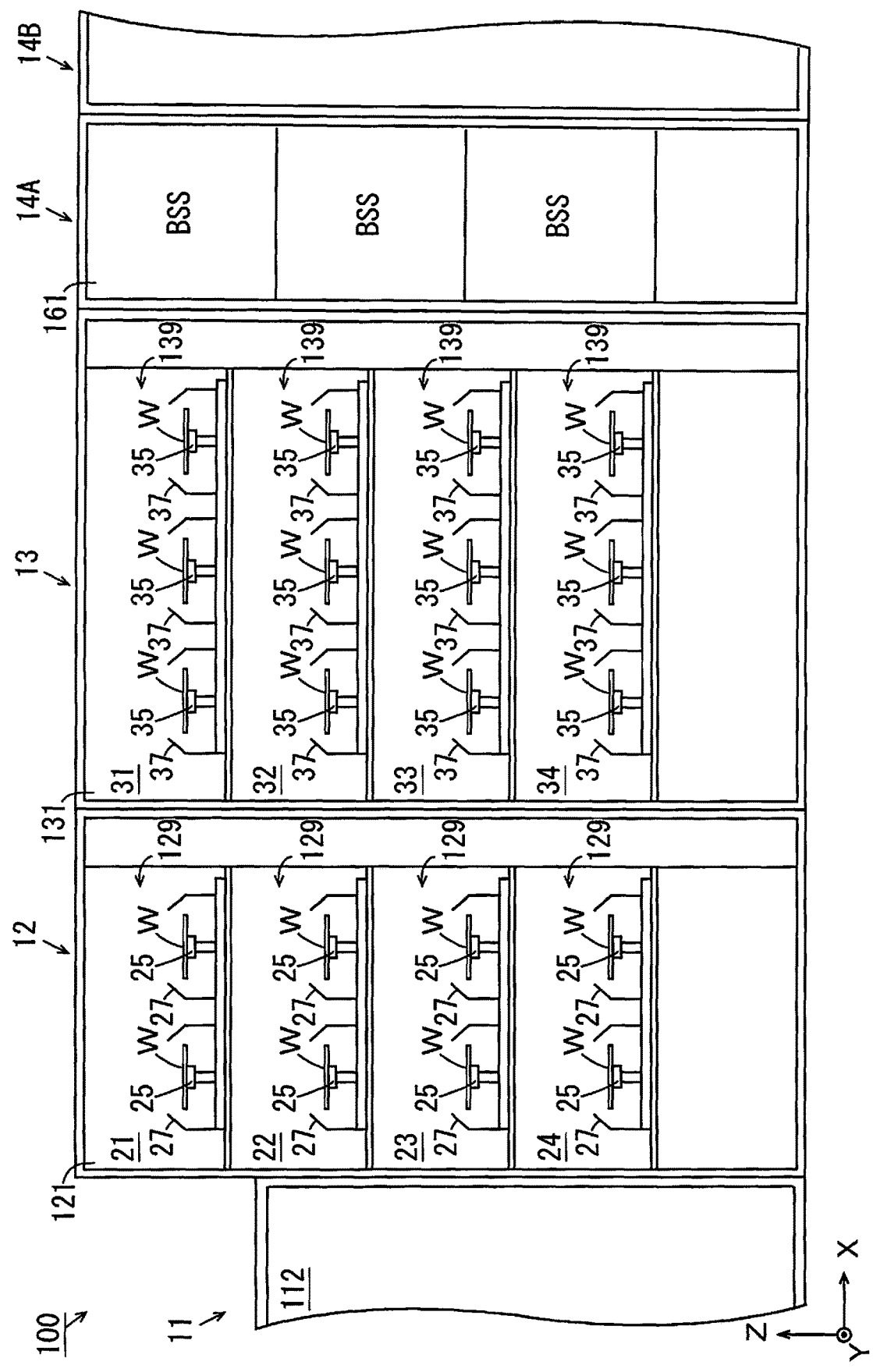
FIG. 2 is a schematic side view showing inner configurations of a coating processing section, a development processing section and a cleaning drying processing section of FIG. 1.
Figure 3:
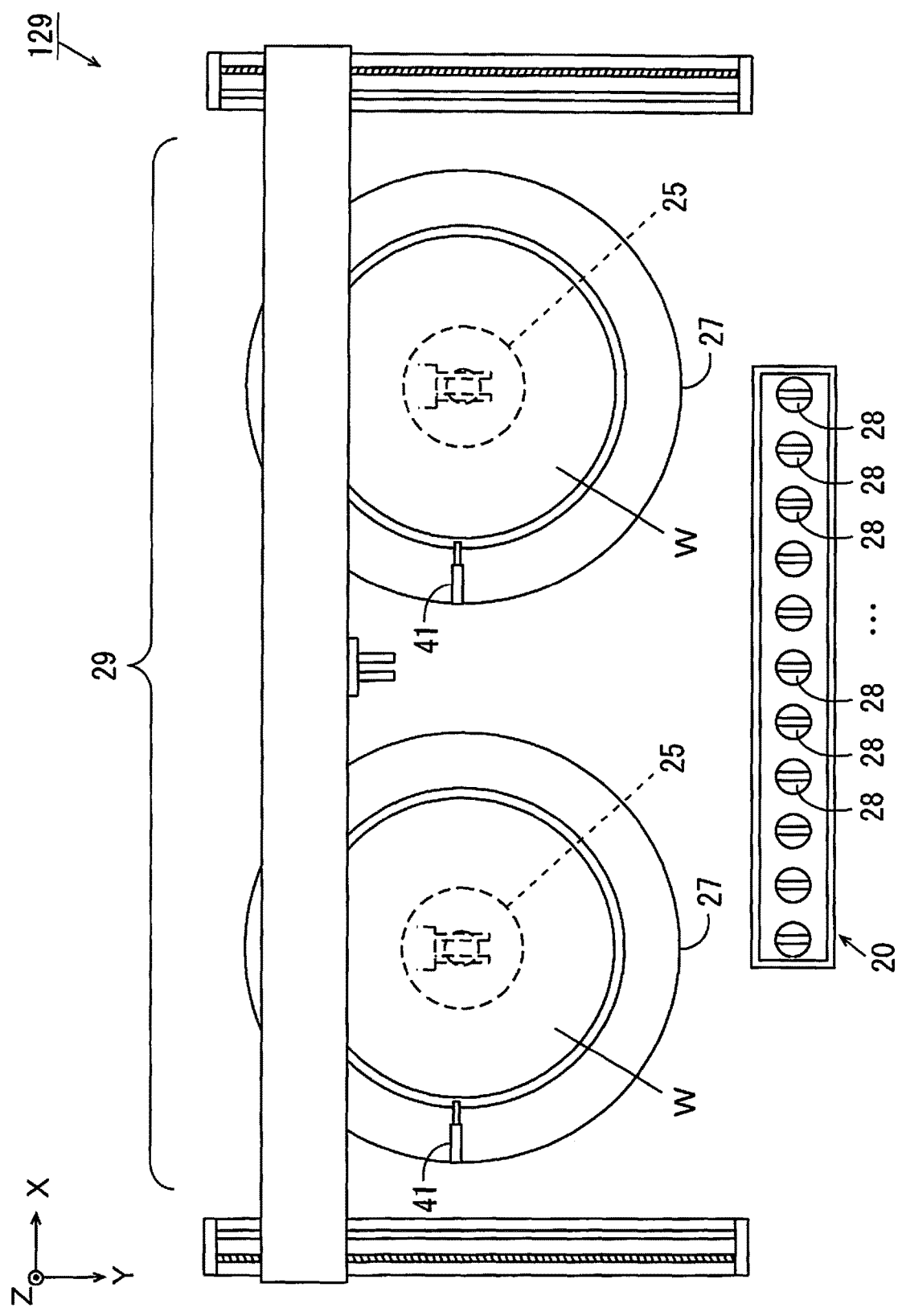
FIG. 3 is a schematic plan view showing a configuration of a coating processing unit.

(2) Coating Processing Section, Development Processing Section and Cleaning Drying Processing Section FIG. 2 is a schematic side view showing inner configurations of the coating processing section 121, the development processing section 131 and the cleaning drying processing section 161 of FIG. 1. As shown in FIG. 2, the coating processing section 121 has coating processing chambers 21, 22, 23, 24 provided in a stack. Each of the coating processing chambers 21 to 24 is provided with a coating processing unit 129. FIG. 3 is a schematic plan view showing a configuration of the coating processing unit 129.

As shown in FIG. 3, each coating processing unit 129 includes a waiting section 20, a plurality of spin chucks 25, a plurality of cups 27, a plurality of coating liquid nozzles 28, a nozzle transport mechanism 29 and a plurality of edge rinse nozzles 41. In the present embodiment, two spin chucks 25, two cups 27, two edge rinse nozzles 41 are provided in each coating processing unit 129.

Each spin chuck 25 is driven to be rotated by a driving device (not shown) (an electrical motor, for example) while holding the substrate W. Each cup 27 is provided to surround the spin chuck 25. During the wait, each coating liquid nozzle 28 is inserted into the waiting section 20. Various types of coating liquids are supplied to each coating liquid nozzle 28 from a coating liquid storage (not shown) through a coating liquid pipe. Any one of the plurality of coating liquid nozzles 28 is moved to a position above the substrate W by the nozzle transport mechanism 29. The coating liquid is discharged from the coating liquid nozzle 28 while the spin chuck 25 is rotated. Thus, the coating liquid is applied to the rotating substrate W.

In the present embodiment, a coating liquid (an anti-reflection liquid) for an anti-reflection film is discharged from the coating liquid nozzle 28 of each of the coating processing chambers 22, 24 of FIG. 2. A coating liquid (a resist liquid) for a resist film is discharged from the coating liquid nozzle 28 of each of the coating processing chambers 21, 23.

A metallic component for efficiently absorbing EUV or a metallic component such as metal oxide for efficiently absorbing EUV is contained in the anti-reflection liquid and the resist liquid as a composition. In the present example, Sn (tin), $HfO_2$ (hafnium oxide) or $ZrO_2$ (zirconium dioxide), for example, is contained in the anti-reflection liquid and the resist liquid as a metallic component. Hereinafter, the coating liquid such as the anti-reflection liquid containing a metallic component or the resist liquid containing a metallic component is collectively termed as a metal-containing coating liquid. Further, a film formed of the metal-containing coating liquid is referred to as a metal-containing coating film.

The edge rinse nozzle 41 is arranged to be directed to a peripheral portion of a surface to be processed of the substrate W held by the spin chuck 25. Here, the surface to be processed refers to a surface of the substrate W on which each type of a trace such as a circuit trace is formed. The peripheral portion of the substrate W refers to a region, having a constant width and extending along an outer periphery of the substrate W, of the surface to be processed of the substrate W.

A removal liquid for removing the metal-containing coating film from the peripheral portion of the substrate W can be discharged from the edge rinse nozzle 41. In addition to an organic solvent including a thinner, butyl acetate, PGMEA (propyleneglycol monomethyl ether acetate) and PGME (propyleneglycol monomethyl ether), for example, an aqueous solution including TMAH (Tetra Methyl Ammonium Hydroxide), an aqueous solution including ammonia and hydrogen peroxide solution or the like may be discharged as the removal liquid. Hereinafter, the removal liquid discharged from the edge rinse nozzle 41 is referred to as a film removal liquid.

With the substrate W rotated by the spin chuck 25, the film removal liquid is discharged to the peripheral portion of the substrate W from the edge rinse nozzle 41. In this case, the coating liquid applied to the peripheral portion of the substrate W is dissolved. Thus, the coating film on the peripheral portion of the substrate W is removed. Thus, even when a transport arm grips the peripheral portion of the substrate W, generation of particles can be avoided, and the substrate processing apparatus 100 can be prevented from being contaminated by particles.

Figure 4:
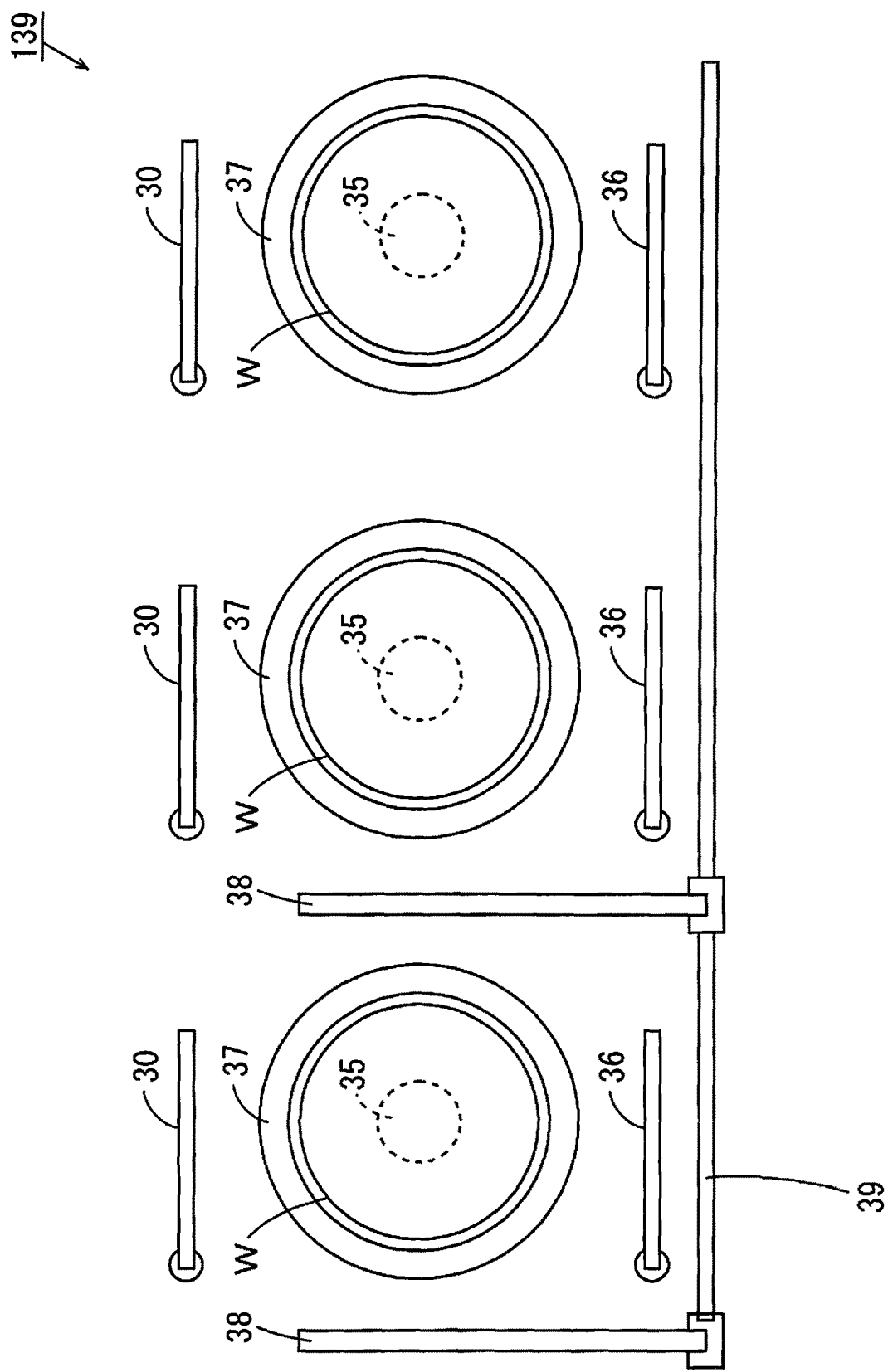
FIG. 4 is a schematic plan view showing a configuration of a development processing unit.

As shown in FIG. 2, development processing chambers 31, 32, 33, 34 are provided in a stack in the development processing section 131. In each development processing chamber 31 to 34, a development processing unit 139 is provided. FIG. 4 is a schematic plan view showing a configuration of the development processing unit 139.

As shown in FIG. 4, each development processing unit 139 includes a plurality of cleaning nozzles 30, a plurality of spin chucks 35, a plurality of rinse nozzles 36 and a plurality of cups 37. Further, the development processing unit 139 includes two slit nozzles 38 that discharge a development liquid, and a movement mechanism 39 that moves these slit nozzles 38 in the X direction. In the present embodiment, three cleaning nozzles 30, three spin chucks 35, three rinse nozzles 36 and three cups 37 are provided in each development processing unit 139.

Each spin chuck 35 is driven to be rotated by a driving device (not shown) (an electric motor, for example) while holding the substrate W. Each cup 37 is provided to surround each spin chuck 35. A development liquid is supplied from a development liquid storage (not shown) to each slit nozzle 38 through a development liquid pipe. One of the slit nozzles 38 is moved to a position above the substrate W by the movement mechanism 39. The development liquid is discharged from the slit nozzle 38 while the spin shuck 35 rotates. Thus, the development processing of the substrate W is performed.

Each cleaning nozzle 30 is provided to be swingable between a waiting position outside of the cup 37 and a cleaning position above the center portion of the substrate W held by the spin chuck 35. During the cleaning processing of the substrate, the cleaning nozzle 30 is moved to the cleaning position. A cleaning liquid is discharged from the cleaning nozzle 30 while the spin chuck 35 rotates. Thus, the cleaning processing of the substrate W is performed.

Each rinse nozzle 36 is provided to be swingable between a waiting position outside of the cup 37 and a rinse position above the center portion of the substrate W held by the spin chuck 35. During rinse processing of the substrate, the rinse nozzle 36 is moved to the rinse position. A rinse liquid is discharged from the rinse nozzle 36 while the spin chuck 35 rotates. Thus, the rinse processing of the substrate W is performed.

As shown in FIG. 2, a plurality (three in the present example) of cleaning drying processing units BSS are provided in the cleaning drying processing section 161. In each cleaning drying processing unit BSS, the peripheral portion and a back surface of the substrate W that has not been exposed are cleaned with use of the above-mentioned organic solvent, the above-mentioned aqueous solution or pure water and then dried. Here, the back surface refers to a surface opposite to the surface to be processed of the substrate W.

(3) Thermal Processing Sections

Figure 5:
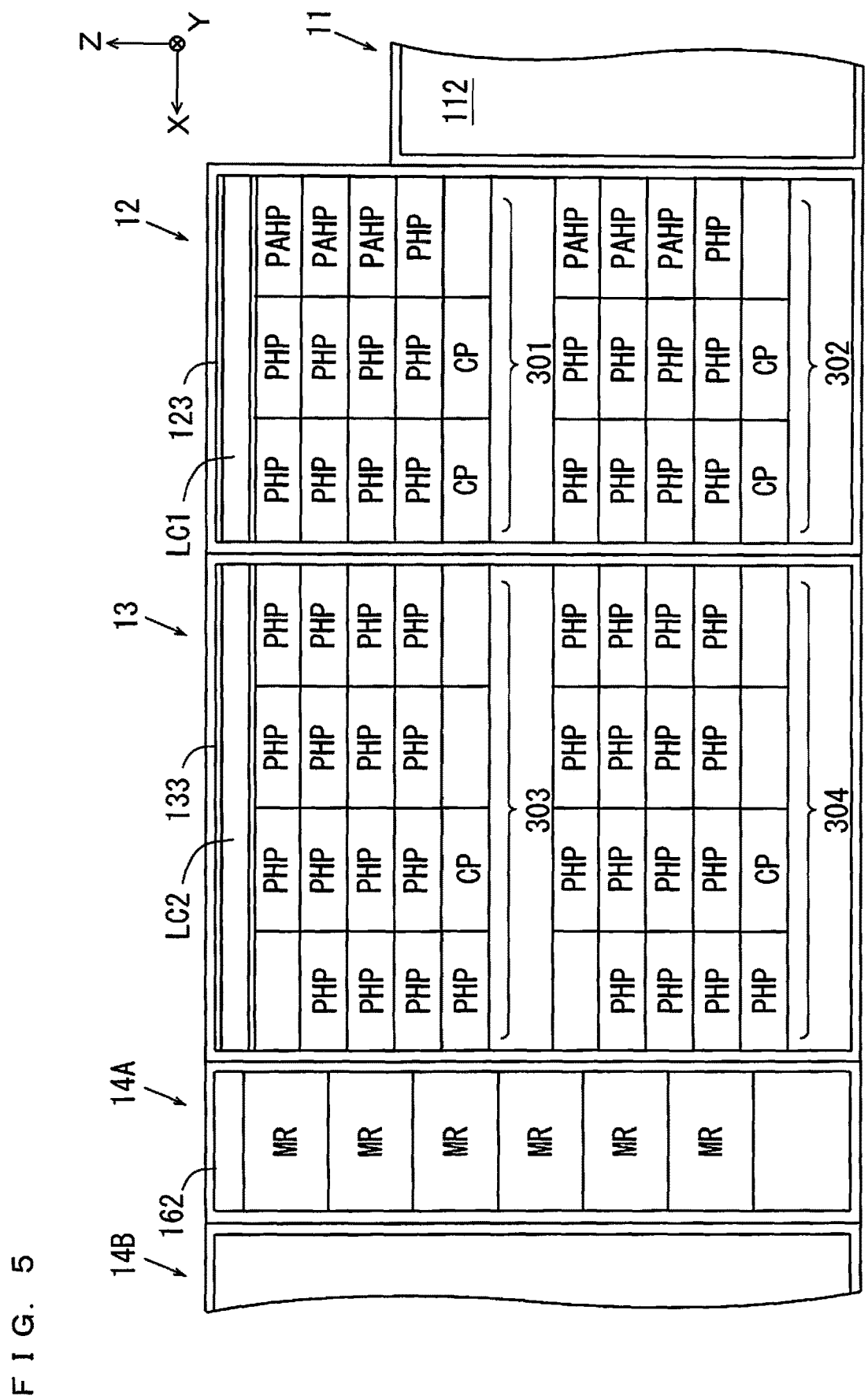
FIG. 5 is a schematic side view showing inner configurations of thermal processing sections and a cleaning drying processing section of FIG. 1.

FIG. 5 is a schematic side view showing inner configurations of the thermal processing sections 123, 133 and the cleaning drying processing section 162 of FIG. 1. As shown in FIG. 5, the thermal processing section 123 has an upper thermal processing section 301 provided above and a lower thermal processing section 302 provided below. A plurality of thermal processing units PHP, a plurality of adhesion reinforcement processing units PAHP and a plurality of cooling units CP are provided in each of the upper thermal processing section 301 and the lower thermal processing section 302.

A local controller LC1 is provided in a top portion of the thermal processing section 123. The local controller LC1 controls operations of the coating processing section 121, the transport section 122 and the thermal processing section 123 based on instructions from the main controller 114 of FIG. 1.

Heating processing and cooling processing are performed on the substrate W in each thermal processing unit PHP. Adhesion reinforcement processing for improving adhesion between the substrate W and the anti-reflection film is performed in each adhesion reinforcement processing unit PAHP. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, cooling processing of the substrate W is performed.

The thermal processing section 133 has an upper thermal processing section 303 provided above and a lower thermal processing section 304 provided below. A cooling unit CP and a plurality of thermal processing units PHP are provided in each of the upper thermal processing section 303 and the lower thermal processing section 304.

A local controller LC2 is provided in a top portion of the thermal processing section 133. The local controller LC2 controls operations of the development processing section 131, the transport section 132 and the thermal processing section 133 based on instructions from the main controller 114 of FIG. 1.

(4) Metal Removal Units

As described above, with the substrate W rotated by the spin chuck 25 of FIG. 3, the film removal liquid is discharged to the peripheral portion of the substrate W from the edge rinse nozzle 41, whereby the metal-containing coating liquid applied to the peripheral portion of the substrate W is dissolved. Thus, the metal-containing coating film on the peripheral portion of the substrate W is removed. However, the metallic component contained in the metal-containing coating liquid may remain on the peripheral portion of the substrate W. Further, when the metal-containing coating liquid flows to the back surface of the substrate W, the metallic component contained in the metal-containing coating liquid remains on the back surface of the substrate W.

When the substrate W is transported in the substrate processing apparatus 100 with the metallic component adhering to the peripheral portion or the back surface of the substrate W, the inside of the substrate processing apparatus 100 and the inside of the exposure device 15 are contaminated by the metallic component. As such, the cleaning drying processing section 162 is provided with a plurality (six in the present example) of metal removal units MR for removing the metallic component adhering to the peripheral portion and the back surface of the substrate W that has not been exposed.

In the metal removal unit MR, an alkaline removal liquid or an acid removal liquid is used as a removal liquid. The alkaline removal liquid is an aqueous solution including ammonia and hydrogen peroxide, for example. The alkaline removal liquid may be TMAH, for example. The acid removal liquid is an aqueous solution including a diluted hydrofluoric acid, for example. The acid removal liquid may be an aqueous solution including a sulfuric acid and hydrogen peroxide, or an aqueous solution including an acetic acid or a chelating agent, for example. The chelating agent includes one type or a plurality of types selected from a group including an organic acid, an organic acid salt, an amino acid, an amino acid derivative, inorganic alkali, an inorganic alkali salt, an alkylamine, an alkylamine derivative, an alkanolamine and an alkanolamine derivative. Hereinafter, the alkaline removal liquid or the acid removal liquid is referred to as a metal removal liquid. The metal removal liquid can dissolve a metallic component contained in the anti-reflection liquid or the resist liquid.

In the present example, three metal removal units MR use a metal removal liquid different from a metal removal liquid used in remaining three metal removal units MR. In this case, according to a type of a metallic component contained in the metal-containing coating liquid, the metallic component adhering to the peripheral portion and the back surface of the substrate W can be removed by a suitable metal removal unit MR.

Figure 6:
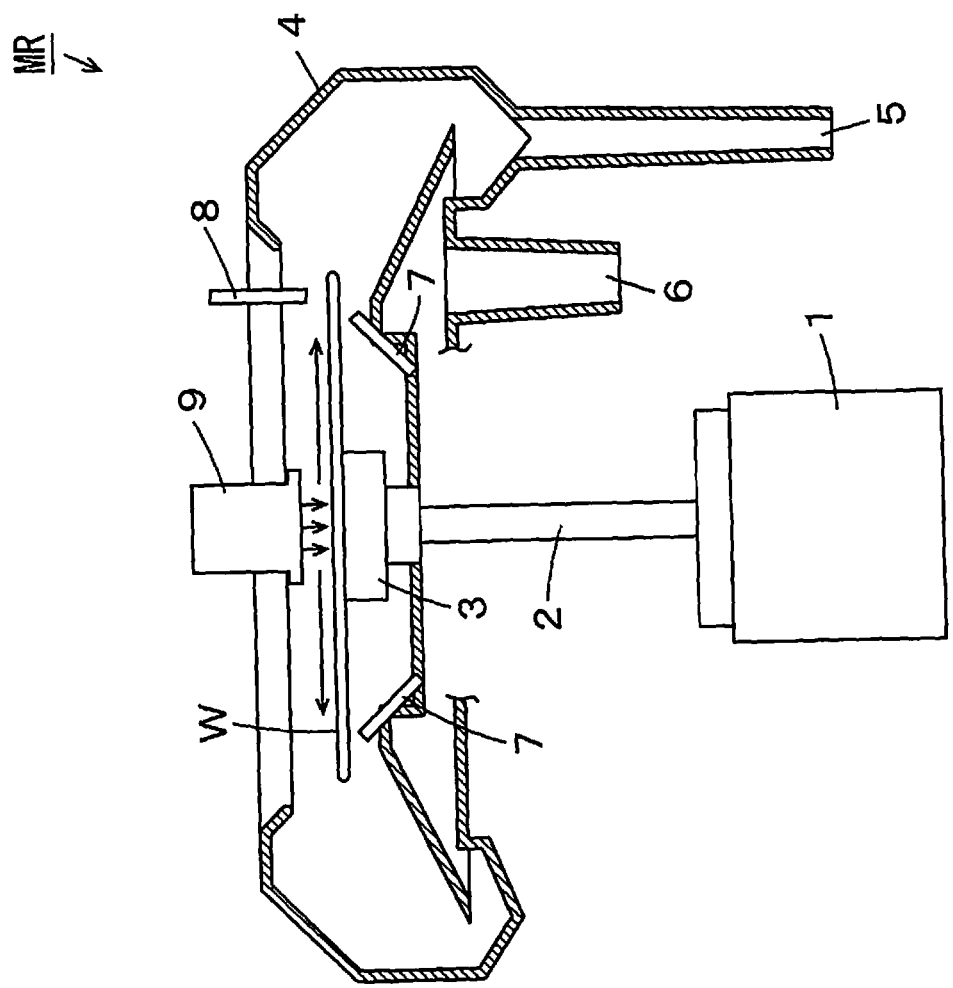
FIG. 6 is a diagram showing a first example of a configuration of a metal removal unit.

FIG. 6 is a diagram showing a first example of a configuration of the metal removal unit MR. As shown in FIG. 6, the metal removal unit MR is provided with a motor 1, a spin chuck 3, a cup 4, two back surface cleaning nozzles 7, a peripheral portion cleaning nozzle 8 and a gas supplier 9. The spin chuck 3 is attached to an upper end of a rotation shaft 2 of the motor 1 to be rotatable about a vertical axis. The cup 4 is arranged to surround the substrate W held by the spin chuck 3. A liquid drainage port 5 and a gas exhaust port 6 are formed in lower portions of the cup 4.

The two back surface cleaning nozzles 7 are arranged to be directed to the back surface of the substrate W held by the spin chuck 3. The metal removal liquid is discharged to the back surface of the substrate W from the back surface cleaning nozzles 7. The peripheral portion cleaning nozzle 8 is arranged to be directed to the peripheral portion of the substrate W held by the spin chuck 3. The metal removal liquid is discharged to the peripheral portion of the substrate W from the peripheral portion cleaning nozzle 8.

The gas supplier 9 is arranged above a substantially center portion of the substrate W held by the spin chuck 3. An inert gas, for example, a nitrogen gas, is ejected to the substantially center portion of the surface to be processed of the substrate W from the gas supplier 9. In this case, the gas ejected from the gas supplier 9 is diffused to the substantially center portion of the surface to be processed of the substrate W. Thus, the metal removal liquid discharged from the peripheral portion cleaning nozzle 8 is prevented from adhering to the coating film formed on the surface to be processed of the substrate W.

Figure 7:
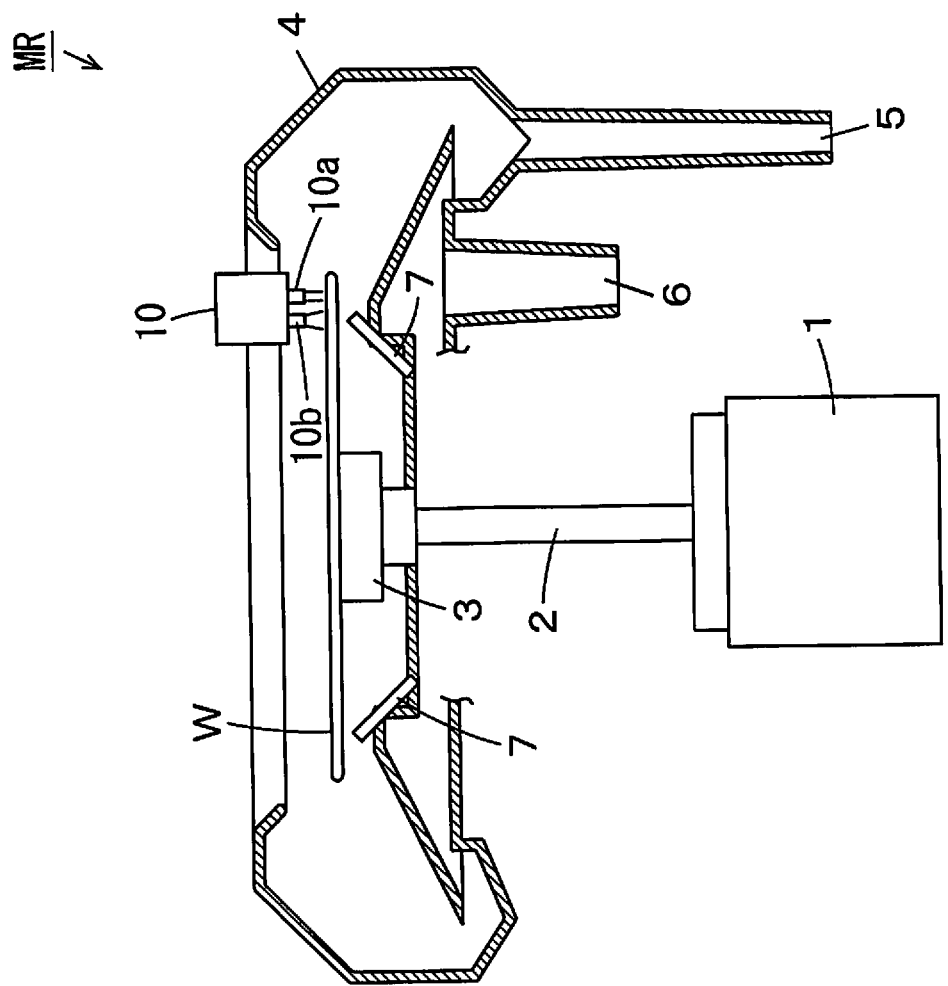
FIG. 7 is a diagram showing a second example of a configuration of a metal removal unit.

FIG. 7 is a diagram showing a second example of the configuration of the metal removal unit MR. As shown in FIG. 7, in the metal removal unit MR in the second example of the configuration, a gas liquid supply nozzle 10 is provided instead of the peripheral portion cleaning nozzle 8 and the gas supplier 9 of FIG. 6. The gas liquid supply nozzle 10 includes a liquid nozzle 10*a* and a gas nozzle 10*b* that are arranged in a horizontal direction. The gas liquid supply nozzle 10 is arranged to be directed to the peripheral portion of the substrate W held by the spin chuck 3. Here, the gas nozzle 10*b* is arranged at a position closer to the center of the substrate W than the liquid nozzle 10*a*.

The metal removal liquid is discharged to the peripheral portion of the substrate W from the liquid nozzle 10*a*. An inert gas, for example, a nitrogen gas, is ejected to the peripheral portion of the substrate W from the gas nozzle 10*b*. In this case, a position of the substrate W to which the gas is ejected from the gas nozzle 10*b* is closer to the center of the substrate W than the position to which the metal removal liquid is discharged from the liquid nozzle 10*a*. Therefore, the metal removal liquid discharged from the liquid nozzle 10*a* is prevented from moving towards the center of the substrate W by the gas ejected from the gas nozzle 10*b*. Thus, the metal removal liquid discharged from the liquid nozzle 10*a* is prevented from adhering to the coating film formed on the surface to be processed of the substrate W.

In the metal removal unit MR of FIGS. 6 and 7, because the metal removal liquid is supplied to the peripheral portion of the substrate W from the peripheral portion cleaning nozzle 8 or the liquid nozzle 10*a*, the metallic component in the metal-containing coating film on the peripheral portion of the substrate W is dissolved, and the metal-containing coating film remains in a region excluding the peripheral portion of the surface to be processed of the substrate W. Further, because the metal removal liquid is supplied to the back surface of the substrate W from the back surface cleaning nozzle 7, even when the metal-containing coating liquid flows to the back surface of the substrate W, the metallic component in the metal-containing coating liquid adhering to the back surface of the substrate W is removed.

Further, in the present example, because the substrate W having the metal-containing coating film that has been cured by the thermal processing section 123 is transported to the metal removal unit MR, even when the gas is discharged to the substrate W from the gas supplier 9 or the gas nozzle 10*b*, the film thickness of the metal-containing coating film is not affected. As a result, the metal-containing coating film having a uniform thickness can be formed on the surface to be processed of the substrate W.

(5) Transport Sections

Figure 8:
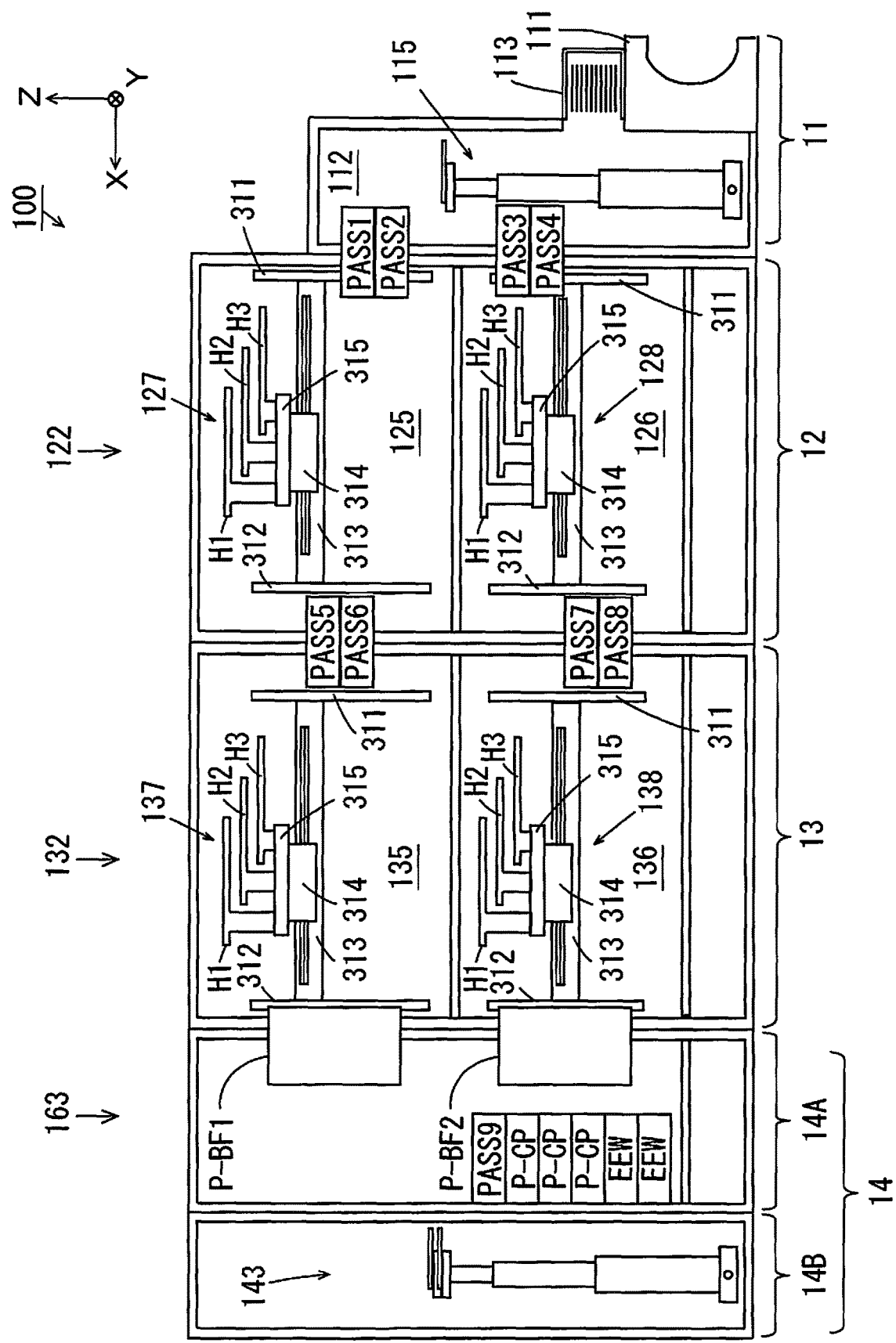
FIG. 8 is a schematic side view showing inner configurations of transport sections.

FIG. 8 is a schematic side view showing inner configurations of the transport sections 122, 132, 163. As shown in FIG. 8, the transport section 122 has an upper transport chamber 125 and a lower transport chamber 126. The transport section 132 has an upper transport chamber 135 and a lower transport chamber 136. The upper transport chamber 125 is provided with a transport mechanism 127, and the lower transport chamber 126 is provided with a transport mechanism 128. Further, the upper transport chamber 135 is provided with a transport mechanism 137, and the lower transport chamber 136 is provided with a transport mechanism 138.

The upper thermal processing section 301 (FIG. 5) is opposite to the coating processing chambers 21, 22 (FIG. 2) with the upper transport chamber 125 interposed therebetween. The lower thermal processing section 302 (FIG. 5) is opposite to the coating processing chambers 23, 24 (FIG. 2) with the lower transport chamber 126 interposed therebetween. Similarly, the upper thermal processing section 303 (FIG. 5) is opposite to the development processing chambers 31, 32 (FIG. 2) with the upper transport chamber 135 interposed therebetween. The lower thermal processing section 304 (FIG. 5) is opposite to the development processing chambers 33, 34 (FIG. 2) with the lower transport chamber 136 interposed therebetween.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9, the plurality of edge exposure units EEW and the plurality of placement cooling units P-CP are provided in the transport section 163 to be adjacent to the carry-in carry-out block 14B.

The placement buffer unit P-BF1 is configured to be capable of carrying in and carrying out the substrate W by the transport mechanism 137 and the transport mechanisms 141, 142 (FIG. 1). The placement buffer unit P-BF2 is configured to be capable of carrying in and carrying out the substrate W by the transport mechanism 138 and the transport mechanisms 141, 142 (FIG. 1). Further, the substrate platform PASS9, the edge exposure units EEW and the placement cooling units P-CP are configured to be capable of carrying in and carrying out the substrates W by the transport mechanisms 141, 142 (FIG. 1) and the transport mechanism 143.

In each edge exposure unit EEW, exposure processing (edge exposure processing) is performed on the peripheral portion of the substrate W. The edge exposure processing is performed on the substrate W, so that a resist film on the peripheral portion of the substrate W is removed during the subsequent development processing. Thus, when the peripheral portion of the substrate W comes into contact with another member after the development processing, the resist film on the peripheral portion of the substrate W is prevented from being stripped and becoming particles.

The substrates W to be transported from the indexer block 11 to the coating block 12 are placed on the substrate platform PASS1 and the substrate platform PASS3. The substrates W to be transported from the coating block 12 to the indexer block 11 are placed on the substrate platform PASS2 and the substrate platform PASS4. The substrates W to be transported from the coating block 12 to the development block 13 are placed on the substrate platform PASS5 and the substrate platform PASS7. The substrates W to be transported from the development block 13 to the coating block 12 are placed on the substrate platform PASS6 and the substrate platform PASS8.

The substrates W to be transported from the development block 13 to the cleaning drying processing block 14A are placed on the placement buffer units P-BF1, P-BF2. The substrates W to be transported from the cleaning drying processing block 14A to the carry-in carry-out block 14B are placed on the placement cooling units P-CP. The substrates W to be transported from the carry-in carry-out block 14B to the cleaning drying processing block 14A are placed on the substrate platform PASS9.

Figure 9:
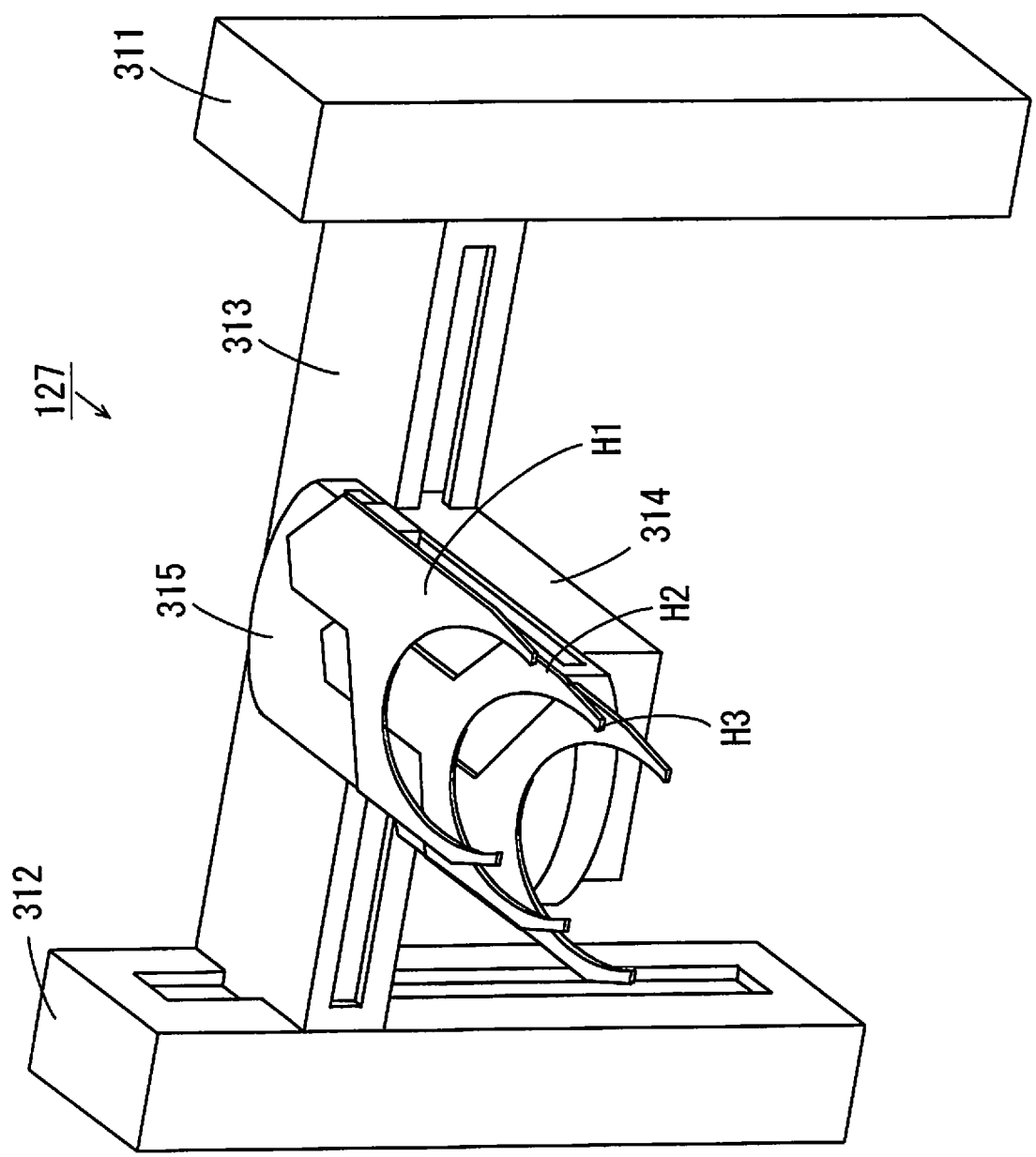
FIG. 9 is a perspective view showing a transport mechanism.

Next, the transport mechanism 127 will be described. FIG. 9 is a perspective view showing the transport mechanism 127. As shown in FIGS. 8 and 9, the transport mechanism 127 includes elongated guide rails 311, 312. As shown in FIG. 8, the guide rail 311 is fixed to the side surface close to the transport section 112 to extend in the vertical direction in the upper transport chamber 125. The guide rail 312 is fixed to the side surface close to the upper transport chamber 135 to extend in the vertical direction in the upper transport chamber 125.

An elongated guide rail 313 is provided between the guide rail 311 and the guide rail 312. The guide rail 313 is attached to the guide rails 311, 312 to be movable in the vertical direction. A moving member 314 is attached to the guide rail 313. The moving member 314 is provided to be movable in a longitudinal direction of the guide rail 313.

An elongated rotation member 315 is rotatably provided on an upper surface of the moving member 314. Hands H1, H2, H3 for holding outer peripheries of the substrates W are attached to the rotation member 315. The hands H1 to H3 are provided to be movable in a longitudinal direction of the rotation member 315. The hand H1 is arranged at a position farther upward than the hand H2, and the hand H2 is arranged at a position farther upward than the hand H3.

The above-mentioned configuration enables the transport mechanism 127 to move in the X and Z directions in the upper transport chamber 125. The transport mechanism 127 can receive the substrates W from and transfer the substrates W to the coating processing chambers 21, 22 (FIG. 2), the substrate platforms PASS1, PASS2, PASS5, PASS6 (FIG. 8) and the upper thermal processing section 301 (FIG. 5) using the hands H1 to H3.

As shown in FIG. 8, the transport mechanisms 128, 137, 138 have the configuration similar to that of the transport mechanism 127. Further, in the present embodiment, the transport mechanism 141 of FIG. 1 has the three hands H1 to H3 similar to those of the transport mechanism 127.

(6) Operation of Development Processing Section

Figure 10A:
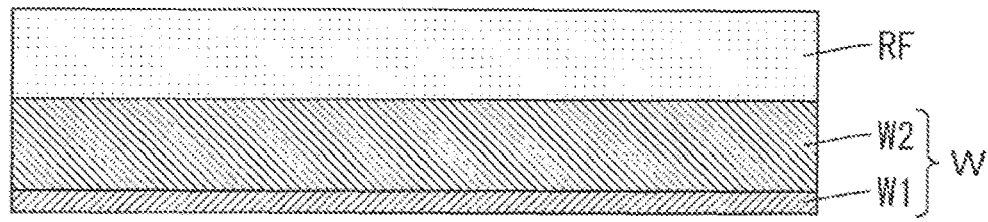
FIGS. 10A to 10E are partially enlarged longitudinal cross sectional views of a substrate on which a resist film is formed.

The operation of the development processing section 131 of FIG. 1 will be described. FIGS. 10A to 11B are partially enlarged longitudinal cross sectional views of the substrate W on which a resist film is formed. In FIGS. 10A to 11B, an anti-reflection film is neither shown nor described. As shown in FIG. 10A, the substrate W is constructed to have an underlayer W2 that is formed on a center layer W1. The center layer W1 includes silicon, for example. The underlayer W2 includes a thin film such as a silicon nitride film or a silicon oxide film. A resist film RF is formed on a surface to be processed of the underlayer W2 of the substrate W by the coating block 12 (FIG. 1).

Figure 10B:
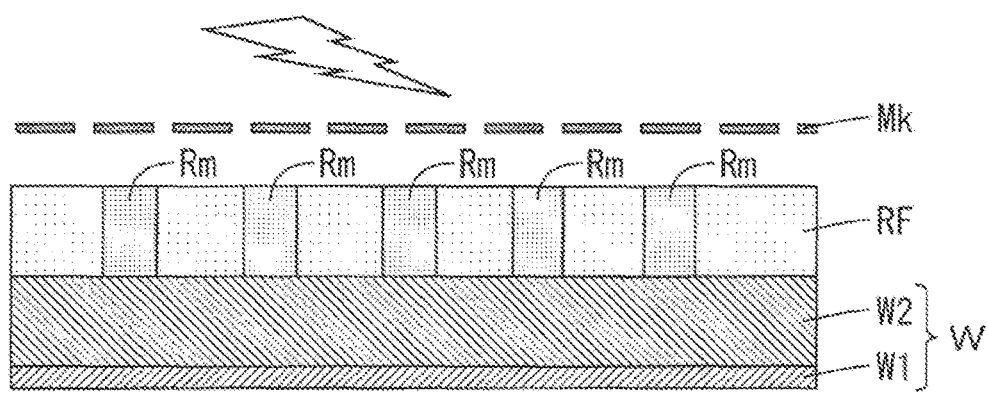
Figure 10C:
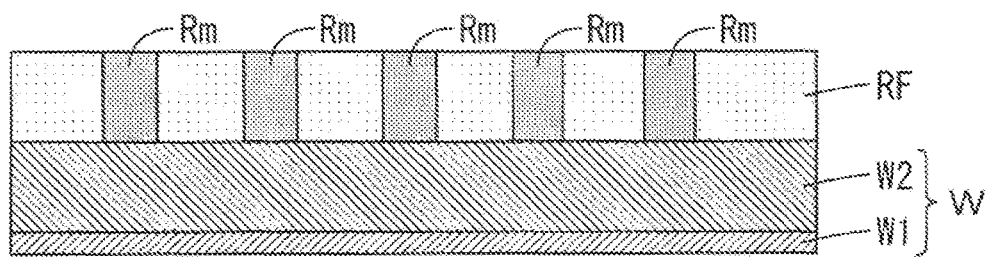

Next, as shown in FIG. 10B, the substrate W is exposed by the exposure device 15 (FIG. 1) through a mask Mk having a predetermined patterned shape. Thus, a removal portion Rm is formed in the resist film RF. Subsequently, as shown in FIG. 10C, post-exposure bake (PEB) processing is performed by the thermal processing section 133 (FIG. 5). Thus, catalysis of a product that is produced by the photochemical reaction during the exposure can be promoted, and chemical reaction that causes a change in dissolution rate of the resist film RF in the development liquid can be activated.

Then, as shown in 10D, development processing is performed by the development processing unit 139 (FIG. 4). Thus, the removal portion Rm of the resist film RF is removed from the underlayer W2 of the substrate W, and a predetermined pattern is formed in the resist film RF. The substrate processing in the present embodiment ends with a series of above-mentioned processing. Thereafter, as shown in FIG. 10E, the substrate W is etched by an etching device (not shown). In this case, a portion of the underlayer W2 exposed from the resist film RF is removed. Thus, a predetermined pattern can be formed in the underlayer W2.

However, a metallic component is contained in the resist liquid. Therefore, when the removal portion Rm of the resist film RF is removed in the development processing of FIG. 10D, a metallic component MC included in the resist film RF may adhere to an exposed portion of the underlayer W2 as shown in FIG. 11A. The rate of etching the portion to which the metallic component MC adheres in the underlayer W2 is smaller than the rate of etching other portions in the underlayer W2. Therefore, as shown in FIG. 11B, a portion W3 of the underlayer W2 to be removed by etching is not removed and remains. That is, a defect occurs in the pattern of the underlayer W2.

Figure 10D:
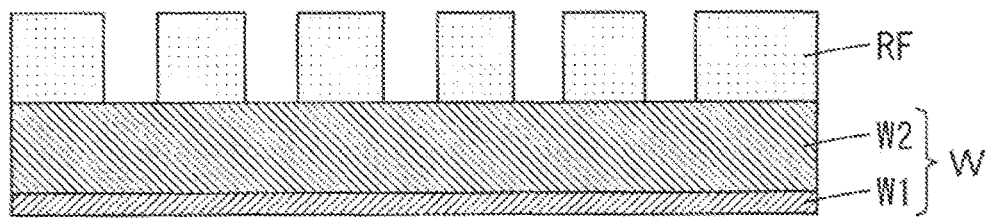
Figure 10E:
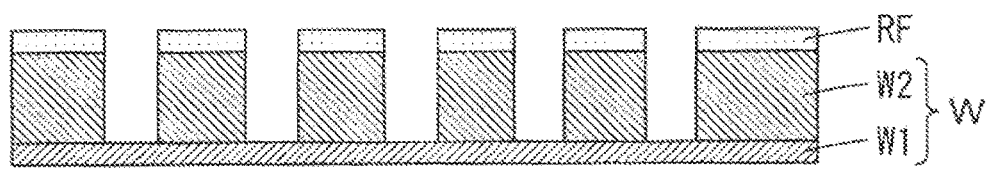
Figure 11A:
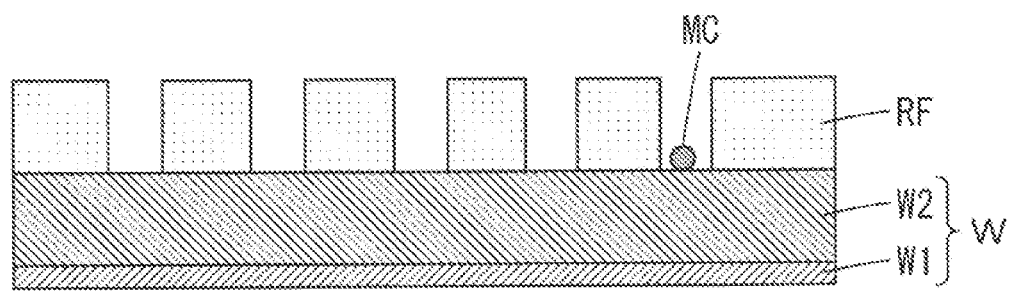
FIGS. 11A and 11B are partially enlarged longitudinal cross sectional views of the substrate on which the resist film is formed.
Figure 11B:
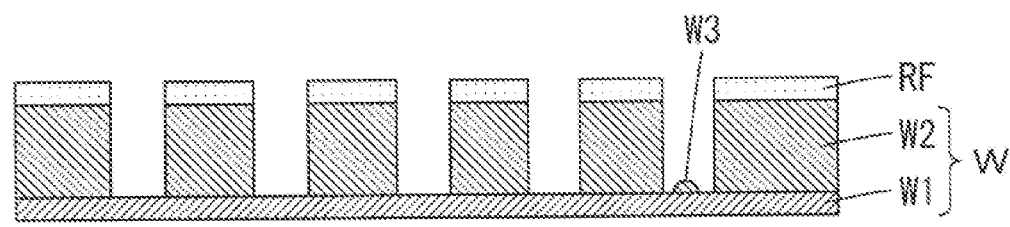

As such, the cleaning liquid is discharged from the cleaning nozzle 30 of FIG. 4 after the development processing of FIG. 10D, whereby the cleaning processing of the substrate W is performed. Further, the rinse liquid is discharged from the rinse nozzle 36 of FIG. 4, so that the rinse processing of the substrate W is performed. Thereafter, spin drying of the substrate W is carried out. Thus, the metallic component MC adhering to the underlayer W2 of the substrate W is removed. As a result, an occurrence of a defect in the pattern of the underlayer W2 can be prevented.

In the present embodiment, positive tone development processing of the substrate W is performed in the development processing unit 139. In this case, an alkaline aqueous solution is used as a development liquid. The alkaline aqueous solution includes TMAH or KOH (potassium hydroxide), for example.

As a cleaning liquid, an aqueous solution to which a chelating agent is added is used, for example. Alternatively, a processing liquid similar to the metal removal liquid used in the metal removal unit MR may be used as the cleaning liquid. An aqueous solution to which ammonia and hydrogen peroxide are added may be used as the cleaning liquid, or an aqueous solution to which a diluted hydrofluoric acid is added may be used as the cleaning liquid, for example.

In the present embodiment, an organic acid such as an acetic acid, an oxalic acid, a tartaric acid or a citric acid, or its salt may be used as the chelating agent. Alternatively, an amino acid such as glycine, alanine, cysteine, histidine, an aspartic acid, arginine or methionine, or its derivative may be used as the chelating agent.

Alternatively, inorganic alkali such as ammonia, or its salt may be used as the chelating agent. Alternatively, alkylamine such as trimethylamine, triethylamine, ethylenediamine or an ethylenediaminetetraacetic acid, or its derivative may be used as the chelating agent. Alternatively, alkanolamine such as monoethanolamine, or its derivative may be used as the chelating agent.

In these case, it is possible to sufficiently remove or sufficiently dissolve the metal adhering to the substrate without damaging the pattern of the resist film RF. Thus, accuracy of the substrate processing can be more sufficiently improved. To the cleaning liquid, one type of a chelating agent may be added, or two or more types of chelating agents may be added in any ratio. Further, a surfactant may further be added to the cleaning liquid.

An amount of an additive included in the cleaning liquid may be suitably adjusted. Further, the development processing unit 139 may be configured such that the type of the cleaning liquid discharged to the substrate W can be changed according to the type of the metallic component contained in the metal-containing coating liquid. Further, the development processing unit 139 may be configured such that the temperature of the cleaning liquid can be changed. Thus, the removal performance of the metallic component MC can be optimized. Further, the damage to the resist film RF caused by the cleaning liquid can be minimized.

In the present embodiment, pure water is used as the rinse liquid, for example. In this case, the cleaning liquid adhering to the substrate is removed by the rinse liquid, so that the substrate can be maintained cleaner.

The rinse processing does not have to be performed. Alternatively, whether the rinse processing is to be performed may be selected according to the type of the cleaning liquid used in the cleaning processing. In particular, when a surfactant is added to the cleaning liquid, the effect of preventing pattern collapse of the underlayer W2 and the effect of improving the roughness of the pattern of the underlayer W2 are acquired by the supply of the cleaning liquid to the substrate W. Therefore, the rinse processing is preferably not performed. Further, it is possible to lower the cost of the substrate processing, shorten the processing time and improve the throughput by not performing the rinse processing.

(7) Substrate Processing

The substrate processing will be described with reference to FIGS. 1, 2, 5 and 8. Each carrier 113 in which unprocessed substrates W are stored is placed on each carrier platform 111 (FIG. 1) in the indexer block 11. The transport mechanism 115 transports the unprocessed substrate W from the carrier 113 to the substrate platform PASS1, PASS3 (FIG. 8). Further, the transport mechanism 115 transports the processed substrate W that is placed on each substrate platform PASS2, PASS4 (FIG. 8) to the carrier 113.

In the coating block 12, the transport mechanism 127 (FIG. 8) sequentially transports the unprocessed substrate W that is placed on the substrate platform PASS1 to the adhesion reinforcement processing unit PAHP (FIG. 5), the cooling unit CP (FIG. 5) and the coating processing chamber 22 (FIG. 2) using the middle hand H2 or the lower hand H3. Next, the transport mechanism 127 sequentially transports the substrate W in the coating processing chamber 22 to the thermal processing unit PHP (FIG. 5), the cooling unit CP (FIG. 5), the coating processing chamber 21 (FIG. 2), the thermal processing unit PHP (FIG. 5) and the substrate platform PASS5 (FIG. 8) using the hand H2, H3.

In this case, the adhesion reinforcement processing is performed on the substrate W in the adhesion reinforcement processing unit PAHP, and then the substrate W is cooled in the cooling unit CP to a temperature suitable for the formation of the anti-reflection film. Next, an anti-reflection film is formed on the substrate W by the coating processing unit 129 (FIG. 2) in the coating processing chamber 22. Subsequently, the thermal processing of the substrate W is performed in the thermal processing unit PHP, and then the substrate W is cooled in the cooling unit CP to a temperature suitable for the formation of the resist film. Then, a resist film is formed on the substrate W by the coating processing unit 129 (FIG. 2) in the coating processing chamber 21. Thereafter, the thermal processing of the substrate W is performed in the thermal processing unit PHP, and the substrate W is placed on the substrate platform PASS5.

Further, the transport mechanism 127 transports the substrate W on which the development processing has been performed and which is placed on the substrate platform PASS6 (FIG. 8) to the substrate platform PASS2 (FIG. 8) using the upper hand H1.

The transport mechanism 128 (FIG. 8) sequentially transports the unprocessed substrate W that is placed on the substrate platform PASS3 to the adhesion reinforcement processing unit PAHP (FIG. 5), the cooling unit CP (FIG. 5) and the coating processing chamber 24 (FIG. 2) using the middle hand H2 or the lower hand H3. Next, the transport mechanism 128 sequentially transports the substrate W in the coating processing chamber 24 to the thermal processing unit PHP (FIG. 5), the cooling unit CP (FIG. 5), the coating processing chamber 23 (FIG. 2), the thermal processing unit PHP (FIG. 5) and the substrate platform PASS7 (FIG. 8) using the hand H2, H3.

Further, the transport mechanism 128 (FIG. 8) transports the substrate W on which the development processing has been performed and which is placed on the substrate platform PASS8 (FIG. 8) to the substrate platform PASS4 (FIG. 8) using the upper hand H1. The contents of processing for the substrate W in the coating processing chambers 23, 24 (FIG. 2) and the lower thermal processing section 302 (FIG. 5) are respectively similar to the contents of processing for the substrate W in the above-mentioned coating processing chambers 21, 22 (FIG. 2) and the upper thermal processing section 301 (FIG. 5).

In the development block 13, the transport mechanism 137 (FIG. 8) transports the substrate W on which the resist film has been formed and which is placed on the substrate platform PASS5 to the placement buffer unit P-BF1 (FIG. 8) using the lower hand H3.

Further, the transport mechanism 137 (FIG. 8) takes out the substrate W on which the exposure processing and the thermal processing have been performed from the thermal processing unit PHP (FIG. 5) adjacent to the cleaning drying processing block 14A using the upper hand H1 or the middle hand H2. The transport mechanism 137 sequentially transports the substrate W to the cooling unit CP (FIG. 5), one of the development processing chambers 31, 32 (FIG. 2), the thermal processing unit PHP (FIG. 5) and the substrate platform PASS6 (FIG. 7) using the hand H1, H2.

In this case, the substrate W is cooled in the cooling unit CP to a temperature suitable for the development processing, and then the development processing, the cleaning processing and the rinse processing of the substrate W are sequentially performed by the development processing unit 139 in any one of the development processing chambers 31, 32. Thereafter, the thermal processing of the substrate W is performed in the thermal processing unit PHP, and the substrate W is placed on the substrate platform PASS6.

The transport mechanism 138 (FIG. 8) transports the substrate W on which the resist film has been formed and which is placed on the substrate platform PASS7 to the placement buffer unit P-BF2 (FIG. 8) using the lower hand H3.

Further, the transport mechanism 138 (FIG. 8) takes out the substrate W on which the exposure processing and the thermal processing have been performed from the thermal processing unit PHP (FIG. 5) adjacent to the interface block 14 using the upper hand H1 or the middle hand H2. The transport mechanism 138 sequentially transports the substrate W to the cooling unit CP (FIG. 5), any one of the development processing chambers 33, 34 (FIG. 2), the thermal processing unit PHP (FIG. 5) and the substrate platform PASS8 (FIG. 8) using the hand H1, H2. The contents of processing for the substrate W in the development processing chambers 33, 34, and the lower thermal processing section 304 are respectively similar to the contents of processing for the substrate W in the above-mentioned development processing chambers 31, 32, and the upper thermal processing section 303.

In the cleaning drying processing block 14A, the transport mechanism 141 (FIG. 1) transports the substrate W placed on the placement buffer unit P-BF1, P-BF2 (FIG. 8) to the metal removal unit MR (FIG. 5) using the lower hand H3. Further, the transport mechanism 141 sequentially transports the substrate W in the metal removal unit MR to the cleaning drying processing unit BSS (FIG. 2), the edge exposure unit EEW (FIG. 8) and the placement cooling unit P-CP (FIG. 8) using the upper hand H1 or the middle hand H2.

In this case, a metallic component remaining on the peripheral portion and the back surface of the substrate W is removed in the metal removal unit MR. Further, the peripheral portion and the back surface of the substrate W are cleaned and dried in the cleaning drying processing unit BSS. Subsequently, the edge exposure processing of the substrate W is performed in the edge exposure unit EEW. Thereafter, the substrate W is cooled in the placement cooling unit P-CP to a temperature suitable for the exposure processing by the exposure device 15 (FIG. 1).

The transport mechanism 142 (FIG. 1) sequentially transports the substrate W on which the exposure processing has been performed and which is placed on the substrate platform PASS9 (FIG. 8) to the thermal processing unit PHP (FIG. 5) in the upper thermal processing section 303 or the lower thermal processing section 304. In this case, PEB processing is performed in the thermal processing unit PHP.

In the carry-in carry-out block 14B, the transport mechanism 143 (FIG. 1) transports the substrate W that has not been exposed and is placed on the placement cooling unit P-CP (FIG. 8) to a substrate inlet of the exposure device 15 (FIG. 1). Further, the transport mechanism 143 takes out the substrate W on which the exposure processing has been performed from a substrate outlet of the exposure device 15, and transports the substrate W to the substrate platform PASS9 (FIG. 8).

In the exposure device 15, the exposure processing is performed on the substrate W by EUV having a significantly short wavelength. In this case, because a metallic component is contained in the coating film on the substrate W, the EUV is efficiently absorbed, and a fine exposure pattern can be formed at high resolution. The exposure method is not limited to this, and the exposure processing may be performed on the substrate W with use of another method.

In the above-mentioned transportation of the substrate W, the substrate W from which the metallic component has not been removed and the substrate W from which the metallic component has been removed are held by different hands of the transport mechanisms 127, 128, 137, 138, 141. Thus, the metallic component is prevented from adhering to the substrate W from which the metallic component has been removed via the hands of the transport mechanisms 127, 128, 137, 138, 141. Thus, the metallic contamination via the transport mechanisms 127, 128, 137, 138, 141 is prevented from spreading.

(8) Effects

In the substrate processing apparatus 100 according to the present embodiment, the metal-containing coating film is formed on the surface to be processed of the substrate W excluding the peripheral portion, and the metal is prevented from remaining on the peripheral portion of the substrate W. Therefore, even when the transport mechanism 115, 127, 128, 137, 138, 141, 142, 143 holds the peripheral portion of the substrate W, the metal does not adhere to the transport mechanism 115, 127, 128, 137, 138, 141, 142, 143. Thus, the metal-containing coating film can be formed on the substrate W, and the metallic contamination can be prevented.

Further, even when the metal in the metal-containing coating film adheres to the substrate W to which the development liquid has been supplied, the metal is removed by the cleaning liquid or dissolved in the cleaning liquid. Thus, the contamination of the substrate processing apparatus 100 and the adjacent exposure device 15 caused by the metal is prevented. Further, the metal does not remain in the underlayer W2 of the surface of the substrate W to which the cleaning liquid has been supplied, so that a defect caused by the metal does not occur in the pattern formed by etching in the underlayer W2. As a result, it is possible to improve the accuracy of the substrate processing while preventing the metallic contamination.

(9) Modified Example (a) First Modified Example

While the indexer block 11, the coating block 12, the development block 13, the cleaning drying processing block 14A and the carry-in carry-out block 14B are arranged in this order in the above-mentioned embodiment, the present invention is not limited to this. The indexer block 11, the coating block 12, the development block 13, the cleaning drying processing block 14A and the carry-in carry-out block 14B may be arranged in another order.

Figure 12:
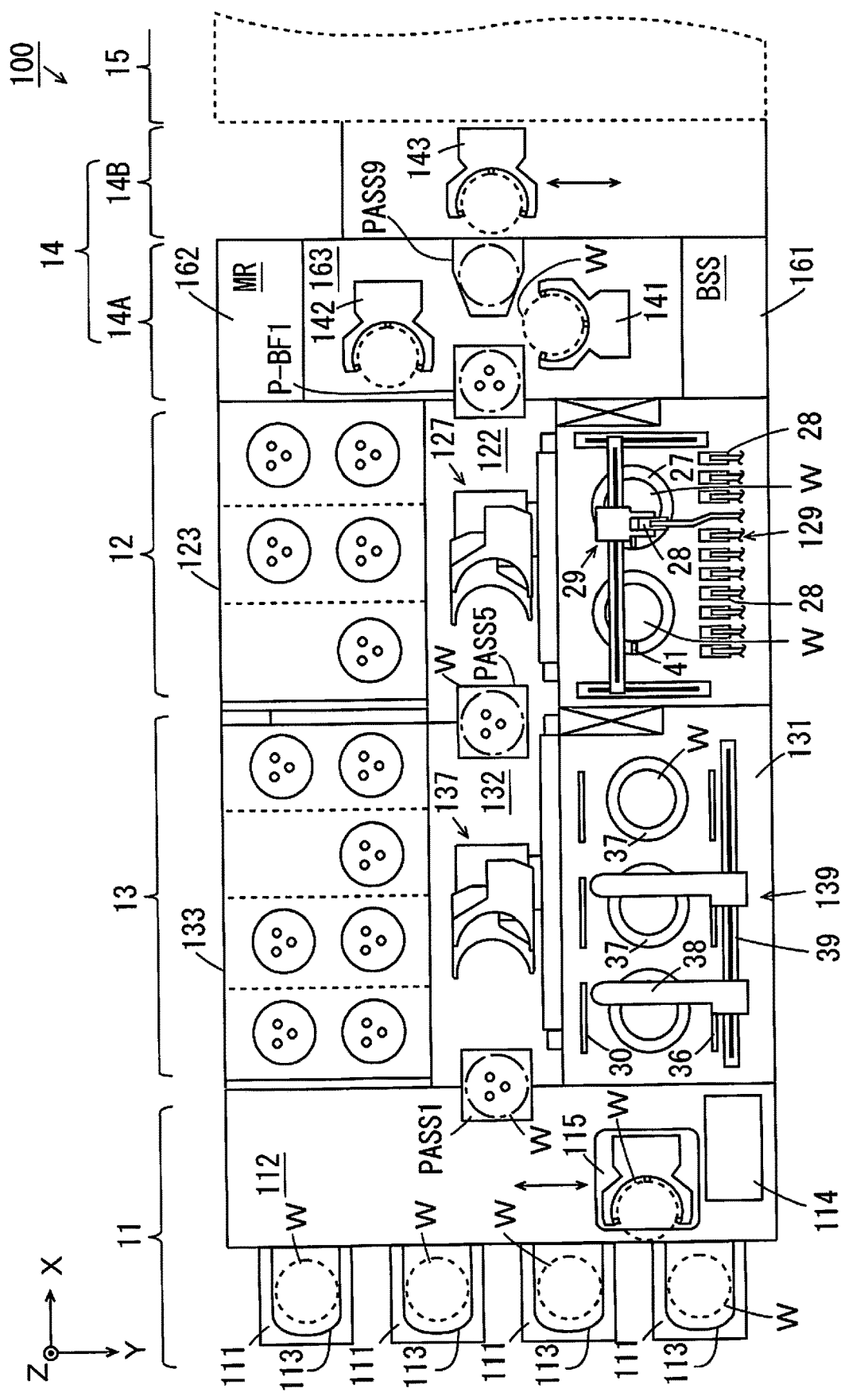
FIG. 12 is a schematic plan view of a substrate processing apparatus according to a first modified example.

FIG. 12 is a schematic plan view of a substrate processing apparatus 100 according to the first modified example. As shown in FIG. 12, in the first modified example, an indexer block 11, a development block 13, a coating block 12, a cleaning drying processing block 14A and a carry-in carry-out block 14B are arranged in this order.

In the substrate processing apparatus 100 of FIG. 12, a substrate W is transported from the indexer block 11 to the coating block 12 by a transport mechanism 137, 138 of the development block 13. In the coating block 12, an antireflection film and a resist film are formed on the substrate W. Thereafter, the substrate W is transported to an exposure device 15 via an interface block 14 and exposed by the exposure device 15.

The exposed substrate W is transported to the development block 13 by a transport mechanism 127, 128 of the coating block 12. The development processing, the cleaning processing and the rinse processing are sequentially performed in the development block 13. The substrate W on which the rinse processing has been performed is transported to the indexer block 11 by a transport mechanism 137, 138.

In the above-mentioned configuration, the metal in a metal-containing coating film on a peripheral portion of the substrate W is instantly removed by a metal removal unit MR in the cleaning drying processing section 162 adjacent to the coating processing section 121. Thus, the substrate processing apparatus 100 can be sufficiently prevented from being contaminated by metal. Further, in this configuration, it is not necessary for the transport mechanism 137, 138 to have more than two hands, and it is not necessary for the transport mechanism 137, 138 to use different hands for holding the substrates W depending on whether the substrates W have been cleaned.

As another example of the configuration of the substrate processing apparatus 100, the indexer block 11, the coating block 12, the cleaning drying processing block 14A, the development block 13 and the carry-in carry-out block 14B may be arranged in this order.

Also in this configuration, the metal in a metal-containing coating film on a peripheral portion of a substrate W is instantly removed by a metal removal unit MR in a cleaning drying processing section 162 adjacent to a coating processing section 121. Thus, a substrate processing apparatus 100 can be sufficiently prevented from being contaminated by metal. Further, it is not necessary for a transport mechanism 137, 138, 141 to have more than two hands, and it is not necessary for the transport mechanism 137, 138, 141 to use different hands for holding the substrates W depending on whether the substrates W have been cleaned.

(b) Second Modified Example

Figure 13:
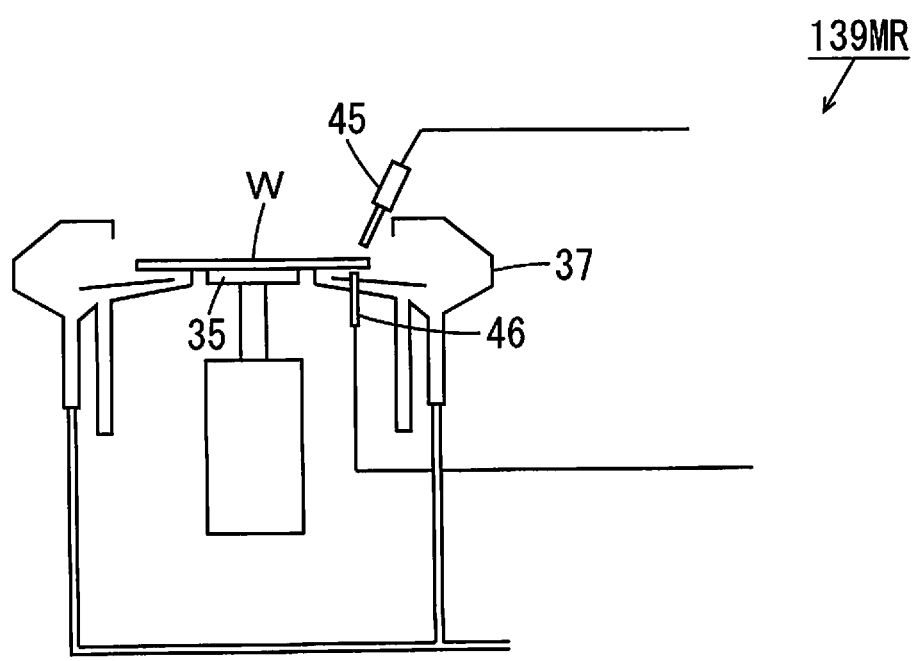
FIG. 13 is a schematic side view showing a configuration of a development metal-removal unit in a second modified example.

As for a substrate processing apparatus 100 according to a second modified example, differences from the substrate processing apparatus 100 of FIG. 1 will be described. In the second modified example, a cleaning drying processing section 162 (a metal removal unit MR) is not provided in a cleaning drying processing block 14A of FIG. 1. Further, a development metal-removal unit of FIG. 13 is provided instead of the development processing unit 139 of FIG. 4. FIG. 13 is a schematic side view showing a configuration of a development metal-removal unit in the second modified example. In FIG. 13, a cleaning nozzle 30, a rinse nozzle 36, a slit nozzle 38 and a movement mechanism 39 are not shown.

As shown in FIG. 13, the development metal-removal unit 139MR further includes an edge rinse nozzle 45 and a back rinse nozzle 46 corresponding to each spin chuck 35. The edge rinse nozzle 45 is arranged to be directed to a peripheral portion of a surface to be processed of a substrate W held by a spin chuck 35. The back rinse nozzle 46 is arranged to be directed to a back surface of the substrate W held by the spin chuck 35. The edge rinse nozzle 45 may be realized by the rinse nozzle 36 of FIG. 4.

As for substrate processing in the present embodiment, differences from the substrate processing in the above-mentioned embodiment will be described with reference to FIGS. 2, 8 and 13. The substrate W on which a resist film is formed in a coating block 12 is placed on a substrate platform PASS5. In a development block 13, a transport mechanism 137 transports the substrate W placed on a substrate platform PASS5 to a development processing chamber 31 or a development processing chamber 32 using a lower hand H3.

In the development processing chamber 31, 32, the substrate W is cleaned by the development metal-removal unit 139MR. Specifically, with the substrate W rotated by a spin chuck 35, a metal removal liquid is discharged to a peripheral portion of the substrate W from the edge rinse nozzle 45. Further, a metal removal liquid is discharged to a back surface of the substrate W from the back rinse nozzle 46. In this case, a metallic component remaining on the peripheral portion and the back surface of the substrate W is dissolved. Thus, the metallic component remaining on the peripheral portion and the back surface of the substrate W is removed. The substrate W may further be cleaned by pure water or the like after being cleaned by the metal removal liquid.

After the substrate W is cleaned by the development metal-removal unit 139MR, the transport mechanism 137 transports the cleaned substrate W from the development processing chamber 31, 32 to the placement buffer unit P-BF1 using the upper hand H1 or the middle hand H2. The subsequent substrate processing is similar to the substrate processing in the above-mentioned embodiment.

Similarly, in the development block 13, a transport mechanism 138 transports the substrate W placed on a substrate platform PASS7 to a development processing chamber 33 or a development processing chamber 34 using a lower hand H3. Thereafter, the transport mechanism 138 transports the cleaned substrate W from the development processing chamber 33, 34 to the placement buffer unit P-BF2 using the upper hand H1 or the middle hand H2.

In this configuration, a metal-containing coating film is formed on the surface to be processed of the substrate W excluding a peripheral portion, and metal is prevented from adhering to the peripheral portion and the back surface of the substrate W. Thus, the metal-containing coating film can be formed on the substrate W, and the metallic contamination can be prevented. Therefore, it is not necessary for a transport mechanism 141 to have more than two hands, and it is not necessary for the transport mechanism 141 to use different hands for holding the substrates W depending on whether the substrates W have been cleaned.

Further, in this configuration, the same type of a processing liquid (TMAH, for example) can be used as a development liquid and the metal removal liquid. In this case, it is not necessary to collect the development liquid and the metal removal liquid separately. Thus, the cost for discarding the processing liquids can be lowered. On the other hand, different types of processing liquids can be used as the development liquid and the metal removal liquid. In this case, the mechanism for collecting the development liquid and the metal removal liquid separately may be provided in the development metal-removal unit 139MR.

Further, when TMAH is used as the metal removal liquid, a metallic component is dissolved, and a metal-containing coating film subtly adhering to the substrate W is etched together with the metallic component. Thus, the metallic component can be removed. Thus, the metallic component adhering to the peripheral portion and the back surface of the substrate W can be efficiently removed.

As another example of the configuration of a substrate processing apparatus 100, a cleaning drying processing section 162 does not have to be provided in the cleaning drying processing block 14A, and a coating metal-removal unit (not shown) may be provided instead of the coating processing unit 129 of FIG. 3. The coating metal-removal unit can perform the processing of removing a metallic component similarly to the development metal-removal unit 139MR in addition to the coating processing similarly to the coating processing unit 129. The mechanism for collecting a coating liquid and a metal removal liquid separately may be provided in the coating metal-removal unit.

Also in this configuration, a metal-containing coating film is formed on a surface to be processed of a substrate W excluding a peripheral portion, and metal is prevented from adhering to a peripheral portion and a back surface of the substrate W. Thus, the metal-containing coating film can be formed on the substrate W, and the metallic contamination can be prevented. Therefore, it is not necessary for the transport mechanism 127, 128, 137, 138, 141 to have more than two hands, and it is not necessary for the transport mechanism 127, 128, 137, 138, 141 to use different hands for holding the substrates W depending on whether the substrates W have been cleaned.

(c) Third Modified Example

Figure 14:
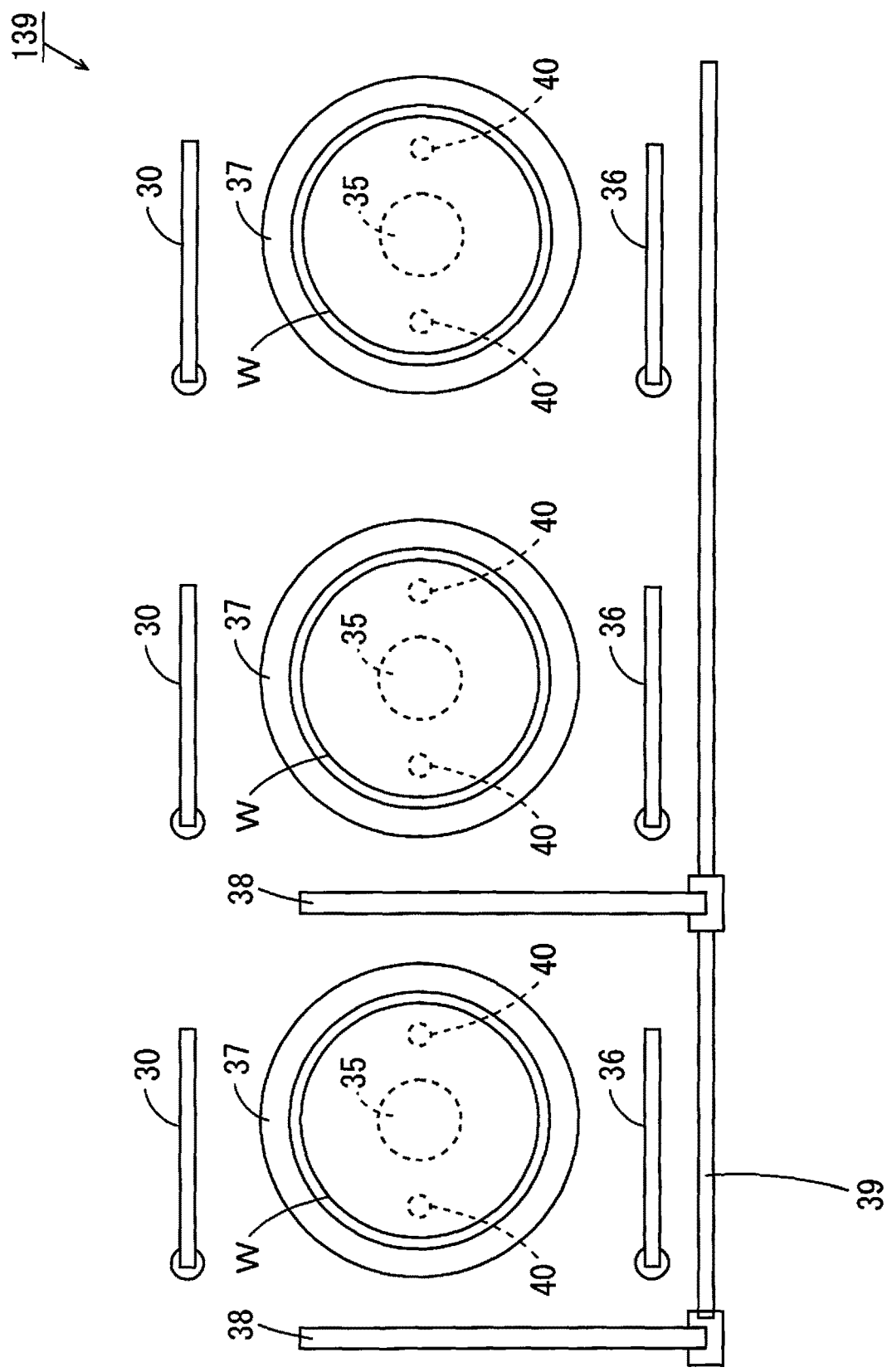
FIG. 14 is a schematic side view showing a configuration of a development processing unit in a third modified example.

As for a substrate processing apparatus 100 according to a third modified example, differences from the substrate processing apparatus 100 of FIG. 1 will be described. FIG. 14 is a schematic side view showing the configuration of a development processing unit 139 in the third modified example. As shown in FIG. 14, in the development processing unit 139 in the present example, one or a plurality of back surface cleaning nozzles 40 corresponding to the spin chuck 35 are further provided. In the example of FIG. 14, two back surface cleaning nozzles 40 corresponding to the spin chuck 35 are provided.

Each back surface cleaning nozzle 40 discharges a cleaning liquid similar to a cleaning liquid discharged from a cleaning nozzle 30 to a back surface of a substrate W, thereby cleaning the back surface of the substrate W. Thus, in FIGS. 11A, 11B and 12, even when a metallic component MC adheres to the back surface of the substrate W when a removal portion Rm of a resist film RF is removed, the metallic component MC on the back surface of the substrate W is removed. As a result, the contamination of the substrate processing apparatus 100 and an exposure device 15 caused by the metallic component MC can be more reliably prevented.

[2] Second Embodiment

As for a substrate processing apparatus 100 according to a second embodiment, differences from the substrate processing apparatus 100 according to the first embodiment will be described. In the present embodiment, negative-tone development processing of the substrate W is performed in a development processing unit 139. In this case, an organic solvent is used as a development liquid. The organic solvent includes a polar solvent or a hydrocarbon solvent, such as a ketone solvent, an ester solvent, an alcohol solvent, an amide solvent or an ether solvent. Specifically, butyl acetate, amyl acetate or 2-Heptanone is used as the development liquid, for example.

An organic solvent to which a chelating agent is added, for example, is used as a cleaning liquid. In this case, it is not necessary to collect the development liquid and the cleaning liquid separately. Thus, the cost for discarding the development liquid and the cleaning liquid can be lowered.

In the present embodiment, an organic acid such as an acetic acid, an oxalic acid, a tartaric acid or a citric acid, or its salt may be used as the chelating agent. In these cases, it is possible to sufficiently remove or sufficiently dissolve the metal adhering to the substrate without damaging a pattern of a resist film RF. Thus, accuracy of the substrate processing can be more sufficiently improved. To the cleaning liquid, one type of a chelating agent may be added, or two or more types of chelating agents may be added in any ratio. Further, a surfactant may further be added to the cleaning liquid.

Similarly to the first embodiment, an amount of an additive included in the cleaning liquid may be suitably adjusted. Further, the development processing unit 139 may be configured such that the type of a cleaning liquid discharged to the substrate W can be changed according to the type of a metallic component contained in a metal-containing coating liquid. Further, the development processing unit 139 may be configured such that the temperature of the cleaning liquid can be changed. Thus, the removal performance of a metallic component MC can be optimized. Further, the damage to the resist film RF caused by the cleaning liquid can be minimized.

In the present embodiment, an organic solvent is used as a rinse liquid, for example. In this case, the cleaning liquid adhering to the substrate is removed by the rinse liquid, so that the substrate can be maintained cleaner. Further, it is not necessary to collect a development liquid, a cleaning liquid and a rinse liquid separately. Thus, the cost for discarding a development liquid, a cleaning liquid and a rinse liquid can be lowered. The organic solvent includes MIBC (methyl isobutyl carbinol) or MIBK (methyl isobutyl ketone), for example.

Similarly to the first embodiment, the rinse processing does not have to be performed. Alternatively, whether the rinse processing is to be performed may be selected according to the type of the cleaning liquid used in the cleaning processing. In particular, when a surfactant is added to the cleaning liquid, the effect of preventing pattern collapse of the underlayer W2 and the effect of improving roughness are acquired by the supply of the cleaning liquid to the substrate W. Therefore, the rinse processing is preferably not performed. Further, it is possible to lower the cost for the substrate processing, shorten the processing time and improve the throughput by not performing the rinse processing.

[3] Third Embodiment

As for a substrate processing apparatus 100 according to a third embodiment, differences from the substrate processing apparatus 100 according to the first embodiment will be described. In the present embodiment, negative-tone development processing of the substrate W is performed in the development processing unit 139 similarly to the second embodiment. In this case, an organic solvent is used as a development liquid. The organic solvent includes a polar solvent or a hydrocarbon solvent, such as a ketone solvent, an ester solvent, an alcohol solvent, an amide solvent or an ether solvent. Specifically, butyl acetate, amyl acetate or 2-Heptanone is used as the development liquid, for example.

An aqueous solution to which a chelating agent is added, for example, is used as a cleaning liquid. In the present embodiment, an organic acid such as an acetic acid, an oxalic acid, a tartaric acid or a citric acid, or its salt may be used as the chelating agent. In these cases, it is possible to sufficiently remove or sufficiently dissolve the metal adhering to a substrate without damaging the pattern of a resist film RF. Thus, accuracy of the substrate processing can be more sufficiently improved. To the cleaning liquid, one type of a chelating agent may be added, or two or more types of chelating agents may be added in any ratio. Further, a surfactant may further be added to the cleaning liquid.

Similarly to the first embodiment, an amount of an additive included in the cleaning liquid may be suitably adjusted. Further, the development processing unit 139 may be configured such that the type of the cleaning liquid discharged to the substrate W can be changed according to the type of a metallic component contained in a metal-containing coating liquid. Further, the development processing unit 139 may be configured such that a temperature of the cleaning liquid can be changed. Thus, the removal performance of the metallic component MC can be optimized. Further, the damage to a resist film RF caused by the cleaning liquid can be minimized.

In the present embodiment, pure water is used as a rinse liquid, for example. In this case, because the cleaning liquid adhering to the substrate is removed by the rinse liquid, the substrate can be maintained cleaner. Further, the cleaning liquid and the rinse liquid may be collected separately.

Similarly to the first embodiment, rinse processing does not have to be performed. Alternatively, whether the rinse processing is to be performed may be selected according to the type of a cleaning liquid used in the cleaning processing. In particular, when a surfactant is added to the cleaning liquid, the effect of preventing pattern collapse of an underlayer W2 and the effect of improving roughness of a pattern of the underlayer W2 are acquired by the supply of the cleaning liquid to the substrate W. Therefore, the rinse processing is preferably not performed. Further, it is possible to lower the cost of the substrate processing, shorten the processing time and improve the throughput by not performing the rinse processing.

[4] Other Embodiments (1) While the development processing unit 139 is provided in the substrate processing apparatus 100 in the above-mentioned embodiment and used as part of the substrate processing apparatus 100 in the above-mentioned embodiment, the present invention is not limited to this. A development processing unit 139 does not have to be provided in a substrate processing apparatus 100, and may be used as a single device in order to perform development processing on a substrate having a metal containing coating film on its surface to be processed.

(2) While the cleaning nozzle 30 is provided separately from the rinse nozzle 36 and the slit nozzle 38 in the above-mentioned embodiment, the present invention is not limited to this. A cleaning nozzle 30 may be provided integrally with a rinse nozzle 36 or another nozzle for supplying a development liquid.

(3) While the cleaning nozzle 30 discharges a cleaning liquid to substantially the center of the substrate W in the above-mentioned embodiment, the present invention is not limited to this. A cleaning nozzle 30 may move above a substrate W while discharging a cleaning liquid. Further, the cleaning nozzle 30 may be held still above a peripheral portion of the substrate W and may discharge the cleaning liquid selectively to the peripheral portion of the substrate W. In this case, the peripheral portion of the substrate W can be selectively cleaned.

(4) While the cleaning liquid is supplied to the substrate W rotated by the spin chuck 35 in the above-mentioned embodiment, the present invention is not limited to this. A cleaning liquid may be supplied to a substrate W held still. For example, a liquid layer of the cleaning liquid may be formed on a surface to be processed of the substrate W. In this case, the substrate W is held still, and the liquid layer of the cleaning liquid is maintained. Thus, a metallic component on a surface to be processed of the substrate W is removed.

(5) While the metallic component is contained in both of the anti-reflection liquid and the resist liquid in the above-mentioned embodiment, the present invention is not limited to this. A metallic component does not have to be contained in an anti-reflection liquid.

(6) In the above-mentioned embodiment, the two spin chucks 25 are provided in the coating processing chamber 21 to 24, and the three spin chucks 35 are provided in the development processing chamber 31 to 34. However, the present invention is not limited to this. One spin chuck 25 may be provided in a coating processing chamber 21 to 24, or three or more than three spin chucks 25 may be provided in a coating processing chamber 21 to 24. Further, two or less than two spin chucks 35 may be provided in a development processing chamber 31 to 34, or four or more than four spin chucks 35 may be provided in a development processing chamber 31 to 34.

(7) While the hand H1 to H3 of the transport mechanism 127, 128, 137, 138, 141 hold the outer periphery of the substrate W in the above-mentioned embodiment, the present invention is not limited to this. A hand H1 to H3 of the transport mechanism 127, 128, 137, 138, 141 may hold a back surface of a substrate W by sucking the substrate W.

(8) While the transport mechanism 127, 128, 137, 138, 141 preferably has the three hands H1 to H3 in the above-mentioned embodiment, the present invention is not limited to this. A transport mechanism 127, 128, 137, 138, 141 may have two or less than two hands, or may have four or more than four hands.

In particular, in the case where a substrate W is held by a suction-type hand, when a metal-containing coating liquid does not adhere to a back surface of the substrate W, it is not necessary for a transport mechanism 127, 128, 137, 138, 141 to have three or more than three hands. Further, it is not necessary to use different hands for holding the substrates W depending on whether the substrates W have been cleaned.

(9) In the above-mentioned embodiment, the plurality of cleaning drying processing units BSS are arranged in the cleaning drying processing section 161, and the plurality of metal removal units MR are arranged in the cleaning drying processing section 162. However, the present invention is not limited to this. Part of or all of cleaning drying processing units BSS may be arranged in a cleaning drying processing section 162, or part of or all of metal removal units MR may be arranged in a cleaning drying processing section 161.

(10) While the edge rinse nozzle 41 is provided in the coating processing unit 129 in the above-mentioned embodiment, the present invention is not limited to this. An edge rinse nozzle 41 does not have to be provided in a coating processing unit 129. Alternatively, an edge rinse nozzle 41 does not have to be provided in a coating processing unit 129 but may be provided in a metal removal unit MR. In this case, the mechanism for collecting a metal removal liquid and a rinse liquid separately may be provided in the metal removal unit MR.

(11) While the edge exposure unit EEW is provided in the interface block 14 in the above-mentioned embodiment, the present invention is not limited to this. An edge exposure unit EEW does not have to be provided in an interface block 14 but may be provided in an upper thermal processing section 301 and a lower thermal processing section 302 in a coating block 12. In this case, after a resist film is formed, the edge exposure processing is performed on a substrate W before the substrate W is placed on a substrate platform PASS5, PASS7.

Alternatively, an edge exposure unit EEW may be provided in a development block 13. In this case, in the first to third embodiments, a transport mechanism 137, 138 of the development block 13 preferably has a fourth hand positioned below a hand H3 in addition to hands H1 to H3.

The transport mechanism 137 sequentially transports a substrate W on which a resist film is formed in a coating block 12 to the edge exposure unit EEW and a placement buffer unit P-BF1 using the hand H3 or the fourth hand. Further, the transport mechanism 138 sequentially transports the substrate W on which the resist film is formed in the coating block 12 to the edge exposure unit EEW and the placement buffer unit P-BF2 using the hand H3 or the fourth hand.

In this configuration, the substrates W are transported from the coating block 12 to an interface block 14 with use of the two lower hands. On the other hand, the substrates W are transported from the interface block 14 to the coating block 12 with use of the upper two hands. Therefore, it is possible to improve the throughput while using different hands for holding the substrates W depending on whether the substrates W have been cleaned.

(12) While the cleaning drying processing section 162 (metal removal unit MR) is provided in the cleaning drying processing block 14A in the above-mentioned embodiment, the present invention is not limited to this. A cleaning drying processing section 162 may be provided in a development block 13.

In this case, a transport mechanism 137, 138 transports a substrate W on which a resist film is formed in a coating block 12 to a cleaning drying processing section 162 using a lower hand H3. Thus, a metallic component remaining on a peripheral portion and a back surface of the substrate W is removed by a metal removal unit MR in the cleaning drying processing section 162. After the substrate W is cleaned by the metal removal unit MR, the transport mechanism 137, 138 transports the cleaned substrate W from the cleaning drying processing section 162 to a placement buffer unit P-BF1, P-BF2 using the upper hand H1 or the middle hand H2.

Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the development processing unit 139 or the development metal-removal unit 139MR is an example of a development unit, the spin chuck 35 is an example of a substrate holder, and the slit nozzle 38 is an example of a development liquid supplier. The cleaning nozzle 30 is an example of a cleaning liquid supplier, the rinse nozzle 36 is an example of a rinse liquid supplier, the back surface cleaning nozzle 40 is an example of a back surface cleaner, the exposure device 15 is an example of an exposure device, and the substrate processing apparatus 100 is an example of a substrate processing apparatus. The coating processing unit 129 is an example of a film formation unit, the metal removal unit MR or the development metal-removal unit 139MR is an example of a peripheral portion removal unit, and the transport mechanism 127, 128, 137, 138, 141, 142, 143 is an example of a transport mechanism.

As each of constituent elements recited in the claims, various other elements having configurations or functions described in the claims can be also used.

INDUSTRIAL APPLICABILITY

The present invention can be effectively utilized for processing various types of substrates.

The invention claimed is:

1. A development unit that performs development processing on a substrate having a film of a coating liquid containing metal formed on a surface to be processed as a metal-containing coating film, comprising:
    a substrate holder that holds the substrate having the metal-containing coating film exposed in a predetermined pattern;
    a development liquid supplier that supplies a development liquid to develop the surface to be processed of the substrate supported by the substrate holder; and
    a cleaning liquid supplier that supplies a cleaning liquid for removing or dissolving metal to the surface to be processed of the substrate to which the development liquid has been supplied by the development liquid supplier, wherein
    the substrate holder holds the substrate on which positive tone development processing is to be performed,
    the development liquid includes an alkaline aqueous solution, and
    the cleaning liquid includes an aqueous solution to which a chelating agent is added, an alkaline aqueous solution or an acid aqueous solution.

2. The development unit according to claim 1, further comprising a rinse liquid supplier that supplies a rinse liquid to the surface to be processed of the substrate to which the cleaning liquid has been supplied by the cleaning liquid supplier, wherein
    the rinse liquid includes an aqueous solution.

3. The development unit according to claim 1, wherein the chelating agent includes one type or a plurality of types selected from a group including an organic acid, an organic acid salt, an amino acid, an amino acid derivative, inorganic alkali, an inorganic alkali salt, an alkylamine, an alkylamine derivative, an alkanolamine and an alkanolamine derivative.

4. The development unit according to claim 1, wherein a surfactant is further added to the cleaning liquid.

5. The development unit according to claim 1, further comprising a back surface cleaner that supplies a cleaning liquid for removing or dissolving metal to a back surface of the substrate to which the development liquid has been supplied by the development liquid supplier, the back surface being opposite to the surface to be processed.

6. A substrate processing apparatus that is arranged to be adjacent to an exposure device that exposes a surface to be processed of a substrate, comprising:
    a film formation unit that forms a metal-containing coating film on the surface to be processed by supplying a coating liquid containing metal to the surface to be processed of the substrate as a metal-containing coating liquid;
    a peripheral portion removal unit that supplies a removal liquid for dissolving metal to a peripheral portion of the substrate after the metal-containing coating film is formed by the film formation unit such that the metal-containing coating film remains in a region excluding the peripheral portion of the surface to be processed of the substrate;
    the development unit according to claim 1 that performs development processing on the substrate having the metal-containing coating film that is formed on the surface to be processed and has been exposed by the exposure device; and
    a transport mechanism that transports the substrate to which a removal liquid has been supplied by the peripheral portion removal unit to the exposure device, and transports the substrate that has been exposed by the exposure device to the development unit.

7. A development unit that performs development processing on a substrate having a film of a coating liquid containing metal formed on a surface to be processed as a metal-containing coating film, comprising:
    a substrate holder that holds the substrate having the metal-containing coating film exposed in a predetermined pattern;
    a development liquid supplier that supplies a development liquid to develop the surface to be processed of the substrate supported by the substrate holder; and
    a cleaning liquid supplier that supplies a cleaning liquid for removing or dissolving metal to the surface to be processed of the substrate to which the development liquid has been supplied by the development liquid supplier, wherein
    the substrate holder holds the substrate on which negative tone development processing is to be performed,
    the development liquid includes an organic solvent, and
    the cleaning liquid includes an organic solvent to which a chelating agent is added or an aqueous solution to which a chelating agent is added.

8. The development unit according to claim 7, further comprising a rinse liquid supplier that supplies a rinse liquid to the surface to be processed of the substrate to which the cleaning liquid has been supplied by the cleaning liquid supplier, wherein
    the cleaning liquid includes the organic solvent to which the chelating agent is added, and
    the rinse liquid includes an organic solvent.

9. The development unit according to claim 7, further comprising a rinse liquid supplier that supplies a rinse liquid to the surface to be processed of the substrate to which the cleaning liquid has been supplied by the cleaning liquid supplier, wherein
    the cleaning liquid includes the aqueous solution to which the chelating agent is added, and
    the rinse liquid has an aqueous solution.

10. The development unit according to claim 7, wherein the chelating agent includes an organic acid or an organic acid salt.

11. A development method of performing development processing on a substrate having a film of a coating liquid containing metal on a surface to be processed as a metal-containing coating film, including:
    holding the substrate having the metal-containing coating film that is exposed in a predetermined pattern by a substrate holder;
    supplying a development liquid to develop the surface to be processed of the substrate supported by the substrate holder; and
    supplying a cleaning liquid for removing or dissolving metal to the surface to be processed of the substrate to which the development liquid has been supplied, wherein the holding the substrate by the substrate holder includes holding a substrate, on which positive tone development processing is to be performed, by the substrate holder, the supplying a development liquid includes supplying an alkaline aqueous solution as the development liquid, and the supplying a cleaning liquid includes supplying an aqueous solution to which a chelating agent is added, an alkaline aqueous solution or an acid aqueous solution as the cleaning liquid.

12. A substrate processing method of exposing a surface to be processed of a substrate with use of an exposure device, including:

forming a metal-containing coating film on the surface to be processed by supplying a coating liquid containing metal to the surface to be processed of the substrate as a metal-containing coating liquid;

supplying a removal liquid for dissolving metal to a peripheral portion of the substrate after the metal-containing coating film is formed such that the metal-containing coating film remains in a region excluding a peripheral portion of the surface to be processed of the substrate;

carrying in the substrate to which the removal liquid has been supplied to the exposure device using a transport mechanism and carrying out the substrate that has been exposed by the exposure device from the exposure device using the transport mechanism; and performing development processing using the development method according to the claim 11 on the substrate having the metal-containing coating film that is formed on the surface to be processed and has been exposed by the exposure device.

13. The development method according to claim 11, further including supplying an aqueous solution as a rinse liquid to the surface to be processed of the substrate to which the cleaning liquid has been supplied.

14. A development method of performing development processing on a substrate having a film of a coating liquid containing metal on a surface to be processed as a metal-containing coating film, including:

holding the substrate having the metal-containing coating film that is exposed in a predetermined pattern by a substrate holder;

supplying a development liquid to develop the surface to be processed of the substrate supported by the substrate holder; and supplying a cleaning liquid for removing or dissolving metal to the surface to be processed of the substrate to which the development liquid has been supplied, wherein the holding the substrate by the substrate holder includes holding a substrate, on which negative tone development processing is to be performed, by the substrate holder, the supplying a development liquid includes supplying an organic solvent as the development liquid, and the supplying a cleaning liquid includes supplying an organic solvent to which a chelating agent is added or an aqueous solution to which a chelating agent is added as the cleaning liquid.

15. The development method according to claim 14, further including supplying the organic solvent as a rinse liquid to the surface to be processed of the substrate to which the cleaning liquid has been supplied, wherein the supplying the cleaning liquid includes supplying the organic solvent to which the chelating agent is added as the cleaning liquid.

16. The development method according to claim 14, further including supplying an aqueous solution as a rinse liquid to the surface to be processed of the substrate to which the cleaning liquid has been supplied, wherein the supplying the cleaning liquid includes supplying the aqueous solution to which the chelating agent is added as the cleaning liquid.

17. A substrate processing apparatus that is arranged to be adjacent to an exposure device that exposes a surface to be processed of a substrate, comprising:

a film formation unit that forms a metal-containing coating film on the surface to be processed by supplying a coating liquid containing metal to the surface to be processed of the substrate as a metal-containing coating liquid;

a peripheral portion removal unit that supplies a removal liquid for dissolving metal to a peripheral portion of the substrate after the metal-containing coating film is formed by the film formation unit such that the metal-containing coating film remains in a region excluding the peripheral portion of the surface to be processed of the substrate;

the development unit according to claim 7 that performs development processing on the substrate having the metal-containing coating film that is formed on the surface to be processed and has been exposed by the exposure device; and a transport mechanism that transports the substrate to which a removal liquid has been supplied by the peripheral portion removal unit to the exposure device, and transports the substrate that has been exposed by the exposure device to the development unit.

18. A substrate processing method of exposing a surface to be processed of a substrate with use of an exposure device, including:

forming a metal-containing coating film on the surface to be processed by supplying a coating liquid containing metal to the surface to be processed of the substrate as a metal-containing coating liquid;

supplying a removal liquid for dissolving metal to a peripheral portion of the substrate after the metal-containing coating film is formed such that the metal-containing coating film remains in a region excluding a peripheral portion of the surface to be processed of the substrate;

carrying in the substrate to which the removal liquid has been supplied to the exposure device using a transport mechanism and carrying out the substrate that has been exposed by the exposure device from the exposure device using the transport mechanism; and performing development processing using the development method according to claim 14 on the substrate having the metal-containing coating film that is formed on the surface to be processed and has been exposed by the exposure device.

* * * * *